(12) United States Patent
Ohkoshi et al.

(10) Patent No.: US 8,535,816 B2
(45) Date of Patent: Sep. 17, 2013

(54) FINE STRUCTURAL BODY, METHOD FOR MANUFACTURING FINE STRUCTURAL BODY, MAGNETIC MEMORY, CHARGE STORAGE MEMORY AND OPTICAL INFORMATION RECORDING MEDIUM

(75) Inventors: Shin-ichi Ohkoshi, Tokyo (JP); Yoshihide Tsunobuchi, Tokyo (JP); Hiroko Tokoro, Tokyo (JP); Fumiyoshi Hakoe, Tokyo (JP); Kazuhito Hashimoto, Tokyo (JP)

(73) Assignee: The University of Tokyo, Tokyo (JP)

( * ) Notice: Subject to any disclaimer, the term of this patent is extended or adjusted under 35 U.S.C. 154(b) by 88 days.

(21) Appl. No.: 13/131,688

(22) PCT Filed: Jul. 13, 2009

(86) PCT No.: PCT/JP2009/062677
§ 371 (c)(1),
(2), (4) Date: Jun. 15, 2011

(87) PCT Pub. No.: WO2010/073766
PCT Pub. Date: Jul. 1, 2010

(65) Prior Publication Data
US 2011/0287282 A1    Nov. 24, 2011

(30) Foreign Application Priority Data
Dec. 25, 2008 (JP) .................... 2008-330752

(51) Int. Cl.
*C01G 23/04* (2006.01)
(52) U.S. Cl.
CPC ...................... *C01G 23/04* (2013.01)
USPC .......... 428/800; 428/826; 428/64.4; 428/323; 428/402; 252/62.51 R; 423/608

(58) Field of Classification Search
None
See application file for complete search history.

(56) References Cited

U.S. PATENT DOCUMENTS

| | | | |
|---|---|---|---|
| 3,502,460 A | 3/1970 | Martin et al. | |
| 2003/0161257 A1 | 8/2003 | Yusu et al. | |
| 2008/0170483 A1* | 7/2008 | Kim | 369/94 |
| 2011/0204278 A1* | 8/2011 | Ohkoshi et al. | 252/62.51 R |

FOREIGN PATENT DOCUMENTS

| | | |
|---|---|---|
| EP | 1 431 351 A1 | 6/2004 |
| EP | 2 374 759 A1 | 10/2011 |
| JP | 61-146714 | 7/1986 |
| JP | H05-9028 A | 1/1993 |
| JP | 05-238734 | 9/1993 |

(Continued)

OTHER PUBLICATIONS

Hitoshi Sato, et al., Journal of The Physical Society of Japan, vol. 75, No. 5., May 2006, pp. 053702/1-053702/4.

(Continued)

*Primary Examiner* — Kevin Bernatz
(74) *Attorney, Agent, or Firm* — Boyle Fredrickson, S.C.

(57) ABSTRACT

There are provided a fine structural body capable of manifesting an unprecedented property; a manufacturing method thereof; and a magnetic memory, a charge storage memory and an optical information recording medium employing such fine structural body. Unlike conventional bulk bodies phase-transited between nonmagnetic semiconductors and paramagnetic metals around about 460K, there can be provided a fine structural body 1 comprised of $Ti_3O_5$, but capable of manifesting an unprecedented property in which a paramagnetic metal property thereof is consistently maintained in all temperature ranges without undergoing phase transition to a nonmagnetic semiconductor.

26 Claims, 21 Drawing Sheets

(56) References Cited

FOREIGN PATENT DOCUMENTS

| | | |
|---|---|---|
| JP | 10-177714 | 6/1998 |
| JP | 2003-238156 A | 8/2003 |
| JP | 2005-120470 | 5/2005 |
| JP | 2005 120470 A | 5/2005 |
| JP | 2008-050208 | 3/2008 |

OTHER PUBLICATIONS

Liaoying Zheng, "The Preparation and Oxygen-Sensing Properties of $\alpha$-Ti3O5 thin film, Sensors and Actuators B, 2003, vol. 88, p. 115-119."

L.K. Keys: "Magnetic Studies of TI3O5", Physics Letters A., vol. 24A, No. 2, Jun. 5, 1967, pp. 628-630, XP22565880, North-Holland Publishing Co., Amsterdam.

G. Hyett et al.: "The use of combinatorial chemical vapor deposition in the synthesis of Ti3-d04N with 0,06<d<0,25: a titanium oxynitride phase isostructural to anosovite", Journal of the American Chemical Society, vol. 129, Nov. 21, 2007, pp. 15541-15548, XP002674381.

M. Onoda et al.: "Phase transitions and the doping effect in Ti3O5", Journal of Physics: Condensed Matter., vol. 10, 1998, pp. 7003-7013, XP002674382, Institute of Physics Publishing, Bristol.

M. Onoda et al.: "Phase transitions of Ti3O5", Journal of Solid State Chemistry, vol. 136. 1998, pp. 67-73, XP002674383, Orlando, FL.

Zheng L: "The preparation and oxygen-sensing properties of alpha-Ti3O5 thin film", Sensors and Actuators B., vol. 88, No. 2, Jan. 15, 2003, pp. 115-119, XP004399079, Elsevier S.A., Switzerland.

Kellerman D G et al.: "Magnetic susceptibility of Ti3-xZrxO5 (0< =x , =0.25)", Inorganic Materals, Plenum Publishing Co. New York, NY, vol. 19, No. 2, Feb. 1, 1983, pp. 218-221, XP008151159.

C. Hauf et al.: Preparation of various titanium suboxide powders by reduction of TiO2 with silicon, Journal of Materials Science, Mar. 15, 1999, vol. 34, No. 6, pp. 1287-1292.

\* cited by examiner

Monoclinic crystal C2/m
$a$ = 9.835(1) Å
$b$ = 3.794(1) Å
$c$ = 9.9824(9) Å
$\beta$ = 90.720(9)°
$d$ = 3.988 g/cm³

Orthorhombic crystal Cmcm
$a$ = 3.798(2) Å
$b$ = 9.846(3) Å
$c$ = 9.988(4) Å
$d$ = 3.977 g/cm³

Monoclinic crystal C2/m
 $a$ = 9.748(1) Å
 $b$ = 3.8013(4) Å
 $c$ = 9.4405(7) Å
 $\beta$ = 91.529(7)°
 $d$ = 4.249 g/cm³

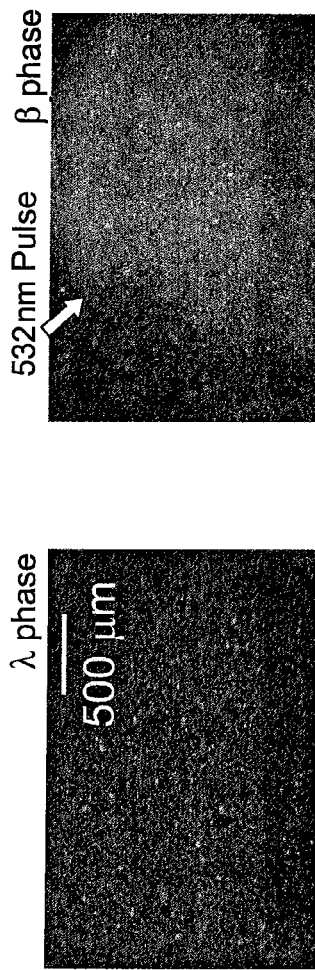
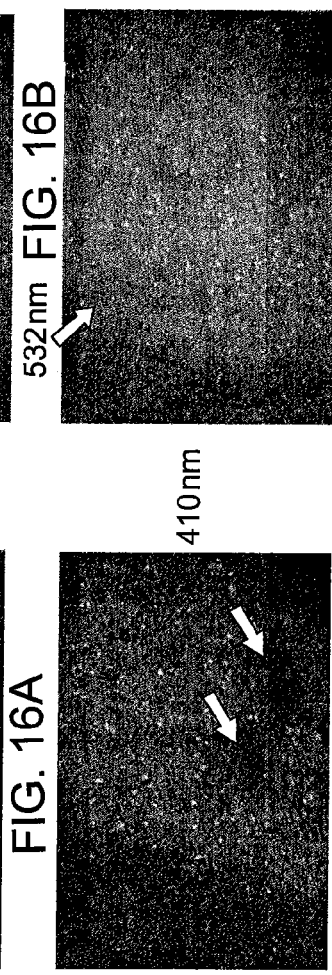
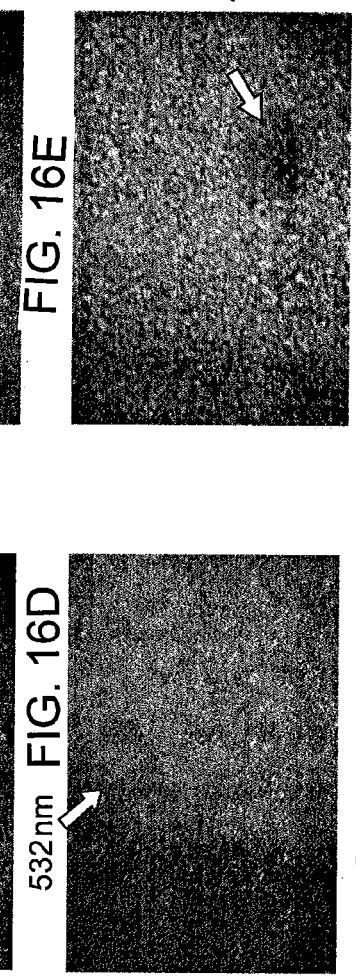

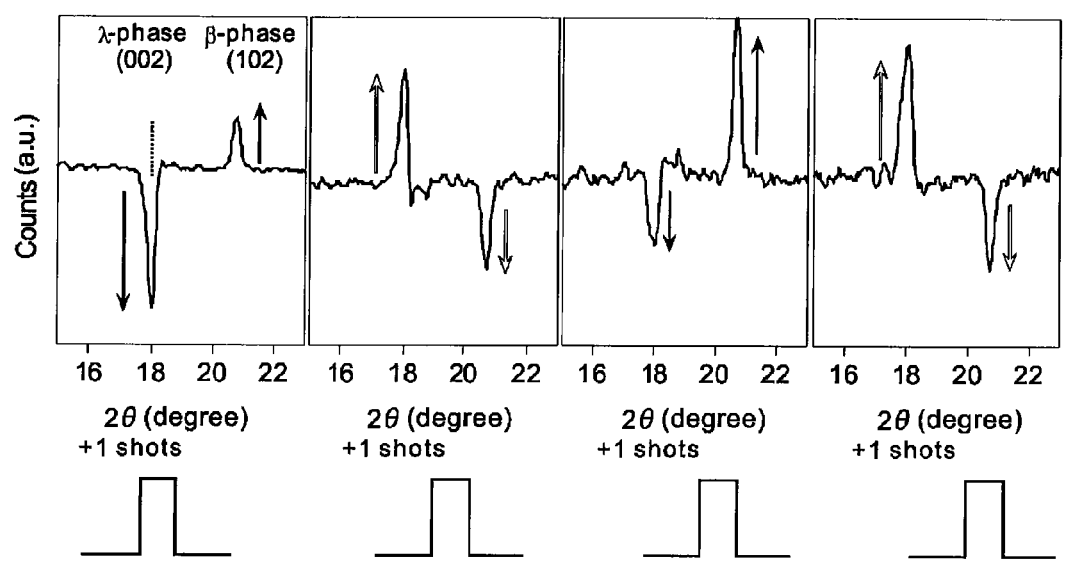
Differential patterns of XRD patterns before and after pulse laser beam irradiation

FINE STRUCTURAL BODY, METHOD FOR MANUFACTURING FINE STRUCTURAL BODY, MAGNETIC MEMORY, CHARGE STORAGE MEMORY AND OPTICAL INFORMATION RECORDING MEDIUM

TECHNICAL FIELD

The present invention relates to a fine structural body, a manufacturing method thereof, a magnetic memory, a charge storage memory and an optical information recording medium, and may be applied to, for example, an oxide containing $Ti^{3+}$ (simply referred to as titanium oxide, hereunder).

BACKGROUND ART

For example, $Ti_2O_3$, as a typical example of titanium oxides, is a phase-transition material having various interesting properties such as the metal-insulator transition and the paramagnetic-antiferromagnetic transition. Further, $Ti_2O_3$ is also known for its infrared absorption property, thermoelectric effect, magnetoelectric (ME) effect and magnetoresistance (MR) effect as has been discovered in recent years. Those properties have only been studied with bulk bodies (~µm size) (e.g., nonpatent document 1), and have not yet been vastly clear in terms of mechanisms thereof.

Nonpatent document 1: Hitoshi SATO, and others, JOURNAL OF THE PHYSICAL SOCIETY OF JAPAN Vol.75, No.5, May, 2006, pp. 053702/1-4

DISCLOSURE OF THE INVENTION

Problem to be Solved by the Invention

Here, according to conventional synthesis methods of such titanium oxide, the bulk bodies are synthesized through baking treatment in vacuum at about 1600° C., carbon reduction of $TiO_2$ at about 700° C., or baking treatment on $TiO_2$, $H_2$, $TiCl_4$ at about 1000° C. Further, there has not yet been reported a case involving nanoparticles (nm size) of $TiO_x$ containing $Ti^{3+}$. In this sense, manifestation of a new property is expected by forming the same into nanoparticles.

In view of the aforementioned problem, it is an object of the present invention to provide a fine structural body capable of manifesting an unprecedented property; a manufacturing method thereof; a magnetic memory, a charge storage memory and an optical information recording medium that employ such fine structural body.

Means for Solving the Problem

The invention according to a first aspect comprises a crystal structure comprised of $Ti_3O_5$ and maintaining a paramagnetic metal state in a temperature range of 0 to 800K.

Further, the invention according to a second aspect forms an orthorhombic crystal structure in the paramagnetic metal state within a temperature range not less than 500K, and a monoclinic crystal structure in the paramagnetic metal state within a temperature range not more than 300K.

Furthermore, according to the invention described in a third aspect, the monoclinic crystal structure in the paramagnetic metal state is phase-transited to a monoclinic β phase of a nonmagnetic semiconductor, when subjected to an external stimulus of an external force or a light.

Furthermore, according to the invention described in a fourth aspect, the crystal structure phase-transited to β phase is phase-transited to the orthorhombic crystal structure in the paramagnetic metal state, as a temperature is increased.

Furthermore, according to the invention described in a fifth aspect, the crystal structure is produced by baking $TiO_2$ particles for a given period of time, in a given hydrogen atmosphere and at a given temperature.

Furthermore, according to the invention described in a sixth aspect, the crystal structure is produced through a baking treatment of an hour or longer, in a hydrogen atmosphere of 0.1 L/min or more and at a temperature of 1100° C. to 1400° C.

Furthermore, the invention according to a seventh aspect comprises a baking step of baking the $TiO_2$ particles for the given period of time, in the given hydrogen atmosphere and at the given temperature, thus manufacturing the fine structural body comprising the crystal structure comprised of $Ti_3O_5$ and maintaining the paramagnetic metal state in the temperature range of 0 to 800K.

Furthermore, according to the invention described in an eighth aspect, the baking step is carried out for an hour or longer, in the hydrogen atmosphere of 0.1 L/min or more and at the temperature of 1100° C. to 1400° C.

Furthermore, the invention according to a ninth aspect comprises a magnetic layer formed by fixing a magnetic material on a supporting body, such magnetic material being provided by using the fine structural body described in any one of the first aspect through the fifth aspect.

Furthermore, the invention according to a tenth aspect comprises a charge storage layer formed by fixing a charge storage material on a supporting body, such charge storage material being provided by using the fine structural body described in any one of the first aspect through the fifth aspect.

Furthermore, the invention according to an eleventh aspect comprises a recording layer formed by using the fine structural body described in any one the first aspect through the sixth aspect, such recording layer allowing a given recording light to be collected thereon at a time of recording information, thereby changing the crystal structure of the fine structural body in the vicinity of a focal point of the recording light so as to form record marks, thus allowing the information to be reproduced based on returned light according to a given reading light irradiated at a time of reproducing the information.

Furthermore, according to the invention described in a twelfth aspect, the recording layer allows the record marks to be formed thereon by collecting the recording light thereon to cause its monoclinic crystal structure in the paramagnetic metal state to undergo phase transition to the monoclinic β phase of the nonmagnetic semiconductor in the vicinity of a focal point of the recording light, while the recording layer allows the record marks to be erased therefrom by collecting formatting light on the monoclinic β phase to cause the β phase to undergo phase transition to the orthorhombic crystal structure in the paramagnetic metal state, and then to the monoclinic crystal structure in the paramagnetic metal state.

Furthermore, according to the invention described in a thirteenth aspect, wavelengths of the recording light, the reading light and the formatting light are 355 to 1064 nm.

Effects of The Invention

According to the first aspect and the seventh aspect of the present invention, there can be provided a fine structural body capable of manifesting an unprecedented property.

Further, according to the ninth aspect of the present invention, there can be provided a magnetic memory employing the fine structural body capable of manifesting an unprecedented property as a magnetic material.

Furthermore, according to the tenth aspect of the present invention, there can be provided a charge storage memory employing the fine structural body capable of manifesting an unprecedented property as a charge storage material.

Furthermore, according to the eleventh aspect of the present invention, there can be provided an optical information recording medium employing the fine structural body capable of manifesting an unprecedented property as a recording layer.

BRIEF DESCRIPTION OF THE DRAWINGS

FIG. 16 is a series of pictures showing changes when the pulse laser beam and a CW laser beam are alternately irradiated.

FIG. 17 is a series of schematic diagrams showing analysis results of XRD patterns indicating phase transitions when irradiation with the pulse laser beam is repeated.

BEST MODE FOR CARRYING OUT THE INVENTION

Preferable examples for carrying out the present invention are described hereunder.

(1) Structure of fine structural body

Figure 1:
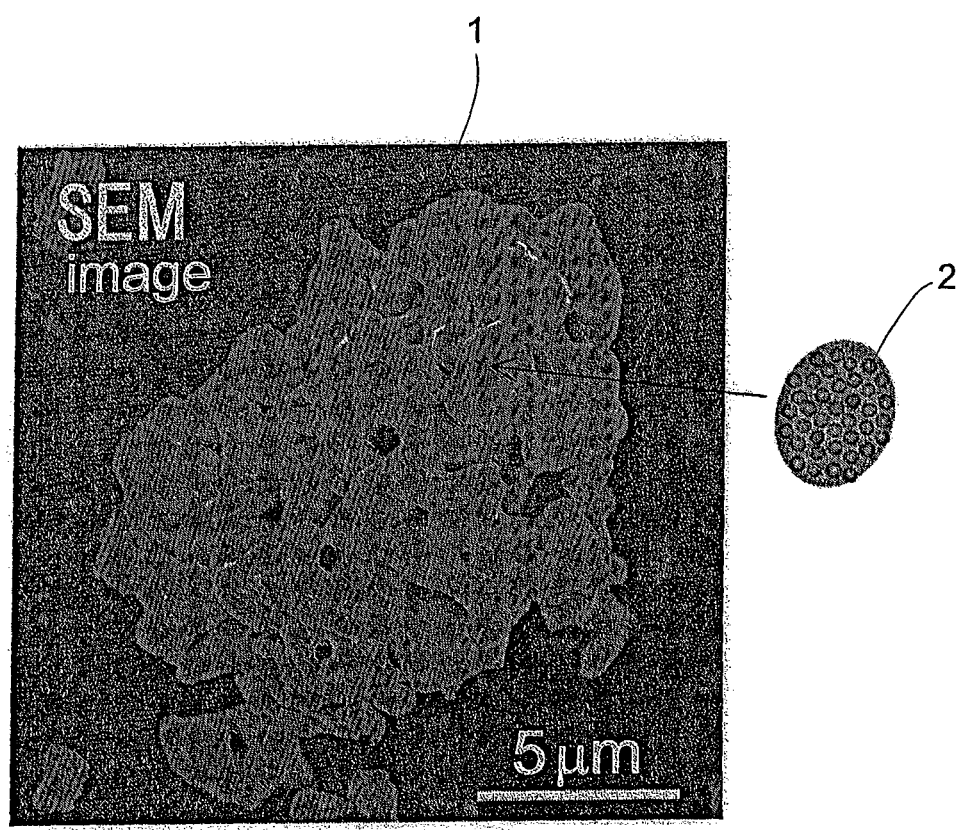
FIG. 1 is an SEM image showing a structure of a fine structural body of the present invention.

FIG. 1 is an SEM image obtained when observing a fine structural body 1, using a scanning electron microscope device (SEM: Scanning Electron Microscope). The fine structural body 1 has a shape of a particle of about 10 μm, and there are formed concavities and convexities on a surface thereof. In fact, the fine structural body 1 is composed of a plurality of nanosized titanium oxide particles 2 bonded with one another and having particle diameters of, for example, about 10 to 20 nm. The fine structural body 1 is allowed to have a given particle shape due to the titanium oxide particles 2 thus bonded with one another.

The titanium oxide particles 2 composing the fine structural body 1 have the composition of $Ti_3O_5$, and crystal structures thereof are allowed to undergo phase transition as the temperature changes. Further, the titanium oxide particles 2 can manifest Pauli paramagnetism in all temperature ranges (e.g., a temperature range of 0 to 800K), and thus allow a paramagnetic metal state thereof to be maintained.

In this sense, the fine structural body 1 of the present invention has an unprecedented feature in which the paramagnetic metal state thereof can be maintained even in a temperature range below about 460K within which conventionally-known bulk bodies comprised of $Ti_3O_5$ (referred to as conventional crystals, hereunder) are phase-transited to nonmagnetic semiconductors.

In fact, within a temperature range equal to or lower than about 300K, the fine structural body 1 is allowed to form a monoclinic crystal phase (referred to as $\lambda$ phase, hereunder (also expressed as $\Lambda$ phase with $\lambda$ capitalized)) in which the paramagnetic metal state of $Ti_3O_5$ is maintained. Further, once the temperature has exceeded about 400K, the fine structural body 1 starts undergoing phase transition and comes to form a mixed phase of $\lambda$ phase and an orthorhombic a phase in the paramagnetic metal state. Furthermore, the fine structural body 1 only has the crystal structure of $\alpha$ phase within a temperature range above about 500K.

Figure 2A:
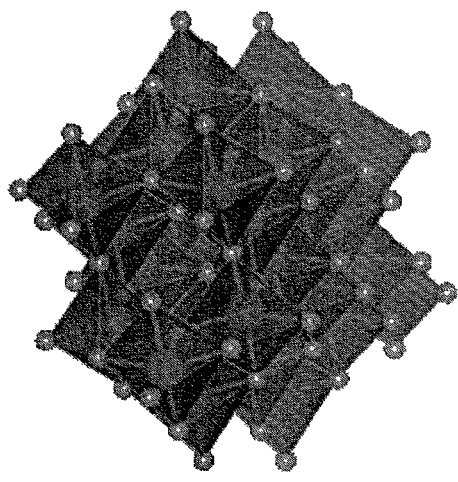
FIG. 2 is a schematic view showing a crystal structure of $\lambda$-$Ti_3O_5$ and a crystal structure of $\alpha$-$Ti_3O_5$.
Figure 2B:
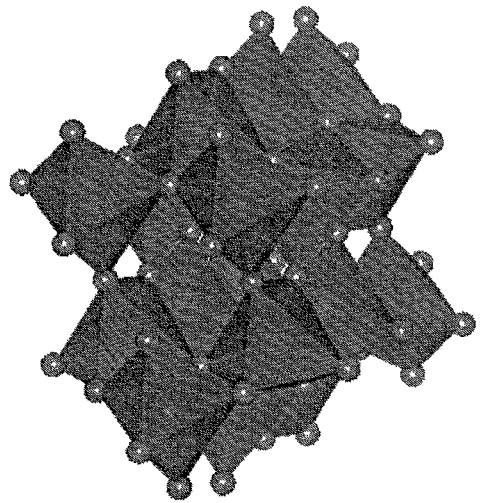

According to this example and as shown in FIG. 2A, within the temperature range equal to or lower than about 300K, the crystal structures of the titanium oxide particles 2 can become those of a $Ti_3O_5$ (referred to as $\lambda$-$Ti_3O_5$, hereunder (also expressed as $\Lambda$-$Ti_3O_5$ with $\lambda$ capitalized)) belonging to a space group C2/m, having lattice constants which are a=9.8370 (3) Å, b=3.78614 (7) Å, c=9.9712 (3) Å, $\beta$=91.259 (2)°, and having a density of d=4.000 g/cm³. On the other hand, within a temperature range equal to or higher than about 500K, the crystal structures of the titanium oxide particles 2 can become those of $\alpha$-$Ti_3O_5$ belonging to a space group Cmcm, and having lattice constants which are a=3.798 (2) Å, b=9.846 (3) Å, c=9.988 (4) Å, d=3. 977 g/cm³.

(2) Method for manufacturing fine structural body

Figure 3:
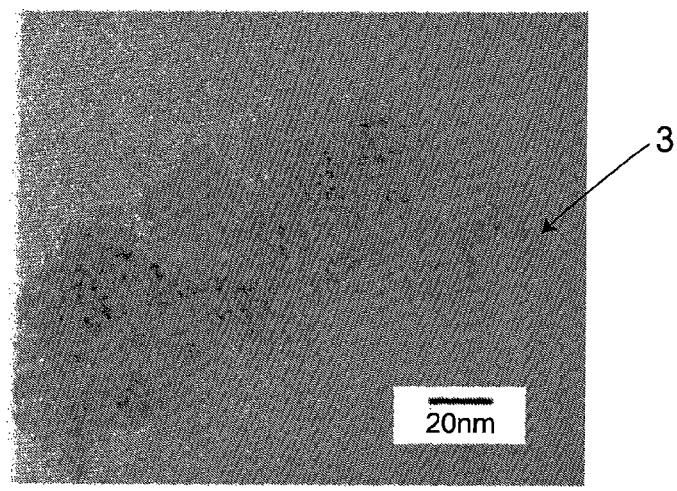
FIG. 3 is a TEM image showing a powder body composed of $TiO_2$ particles.

A method for manufacturing the fine structural body 1 is described hereunder. Particularly, there is prepared a given amount of a powder body composed of nanosized $TiO_2$ particles having the crystal structures of the anatase type. Here, for example, as $TiO_2$ particles composing a powder body 3 shown in FIG. 3, there are employed anatase-type $TiO_2$ particles having particle diameters of about 7 nm (product name "ST-01" by ISHIHARA SANGYO KAISHA, LTD.), and there are actually prepared about 3 to 9 g of such $TiO_2$ particles.

Next, the powder body 3 composed of such $TiO_2$ particles is subjected to a baking treatment for a given period of time (1 to 5 hours), in a hydrogen atmosphere (0.3 to 1.0 L/min) and at a given temperature (about 1200° C.). In this way, due to reduction reactions of the $TiO_2$ particles, there are produced the titanium oxide particles 2 having the composition of $Ti_3O_5$ ($Ti^{3+}_2Ti^{4+}O_5$) that is an oxide containing $Ti^{3+}$. Further, the plurality of the titanium oxide particles 2 are bonded with one another at the time of the baking treatment, thus manufacturing the fine structural body 1.

Here, verifications were made by changing the hydrogen atmosphere, the temperature and the period of time that are required for the baking treatment. As a result, it became evident that there could be manufactured the fine structural body 1 having the composition of $\lambda\text{-}Ti_3O_5$ by at least about 50% or more, as long as the hydrogen atmosphere was 0.1 L/m or more, the temperature at the time of the baking treatment was 1100° C. to 1400° C., and the time spent for the baking treatment was an hour or longer.

(3) Experimental results

The fine structural body 1 of the present invention manufactured according to the aforementioned manufacturing method was found to have the following features through experiments.

Figure 4:
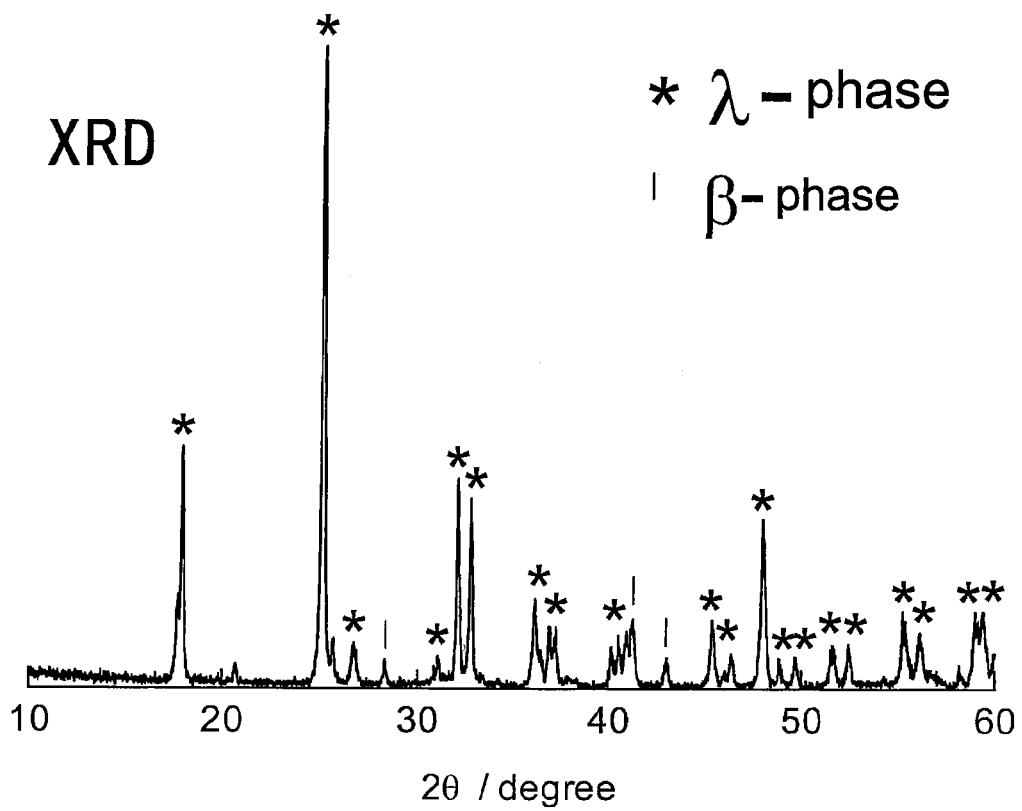
FIG. 4 is a graph showing an analysis result of an XRD pattern of the fine structural body.

(3-1) X-ray diffraction (XRD) measurement of fine structural body within a temperature range of 0 to 300K XRD measurement of the fine structural body 1 was performed within a temperature range of 0 to 300K. Here, FIG. 4 shows an analysis result of an XRD pattern of the fine structural body 1, in which a horizontal axis represents diffraction angles, while a vertical axis represents diffraction X-ray intensities. As shown in FIG. 4, since the locations of the peaks particular to this XRD pattern were different from those in an XRD pattern of $\alpha\text{-}Ti_3O_5$ (not shown), it was confirmed that the crystal structure of the fine structural body 1 was not that of $\alpha\text{-}Ti_3O_5$. Meanwhile, according to this XRD pattern, since there were partially observed peaks identical to those of β phase, it was confirmed that there was manifested β phase by a certain percentage.

Figure 5:
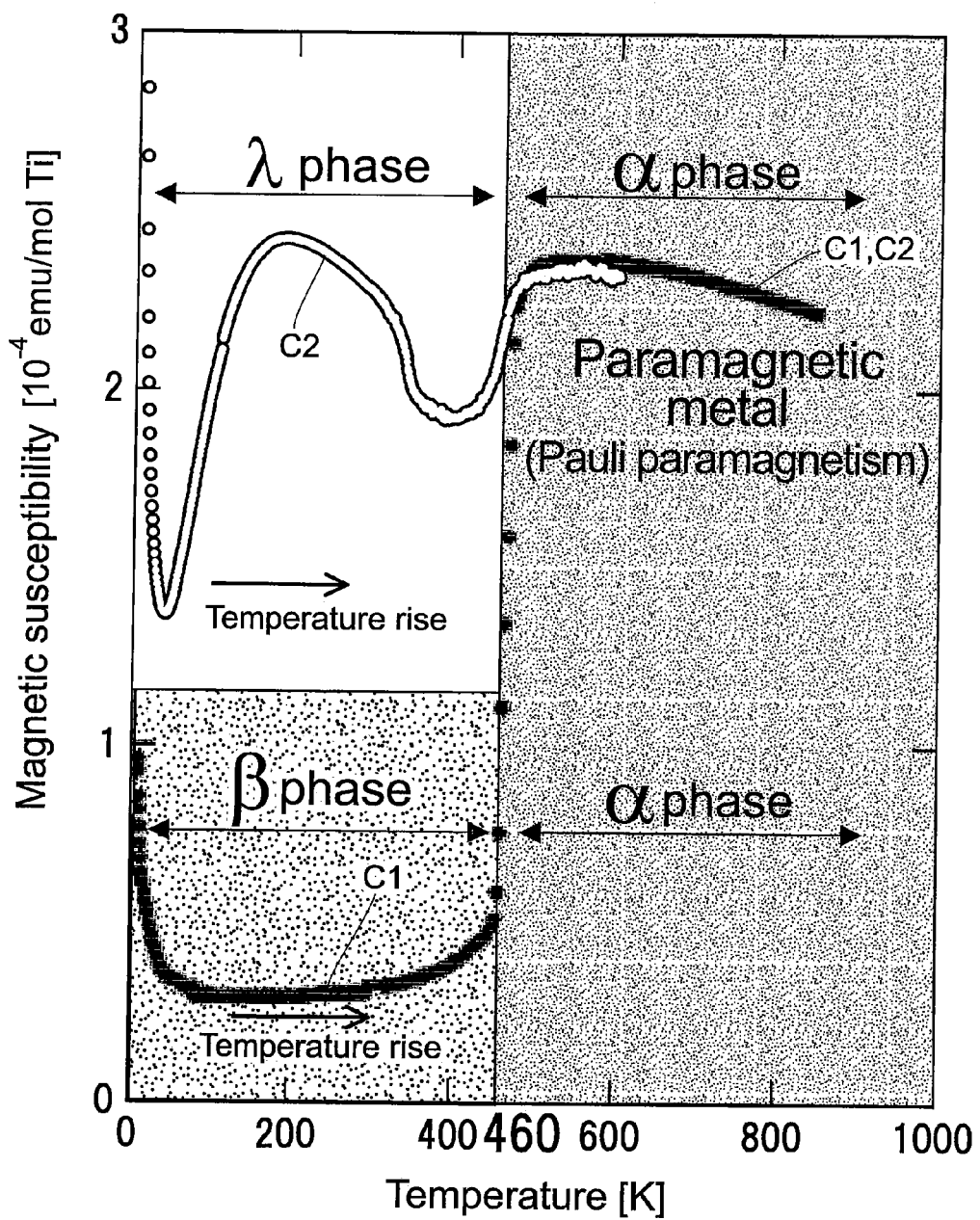
FIG. 5 is a graph showing correlations between the temperature and magnetic susceptibilities of conventional bulk bodies and the fine structural body of the present invention.

However, as indicated by a curve c1 shown in FIG. 5, the conventional crystals are phase-transition substances whose crystal structures become those of $\alpha\text{-}Ti_3O_5$ (α phase) when the temperature is higher than about 460K, and those of $\beta\text{-}Ti_3O_5$ (β phase) when the temperature is lower than about 460K. Here, the conventional crystals turned into β phase within the temperature range below about 460K have monoclinic crystal structures, and are slightly magnetized around 0K by being Curie paramagnetic due to lattice defect. However, such conventional crystals turned into β phase within the temperature range below about 460K can become nonmagnetic ions and nonmagnetic semiconductors accordingly, within a temperature range below 460K.

Figure 6:
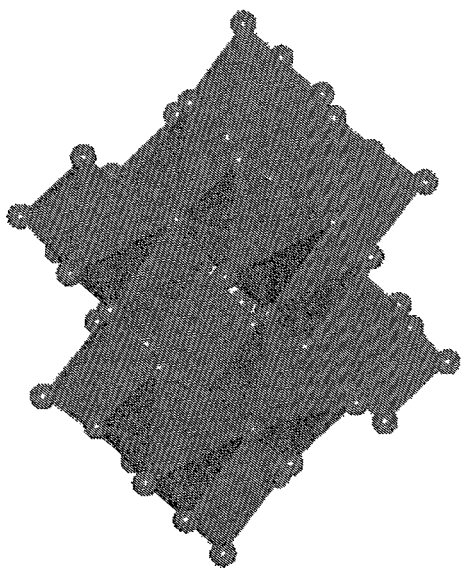
FIG. 6 is a schematic view showing a crystal structure of $\beta$-$Ti_3O_5$.

Particularly, as shown in FIG. 6, the conventional crystals within the temperature range below about 460K have crystal structures of $\beta\text{-}Ti_3O_5$ belonging to the space group C2/m and having lattice constants which are a=9.748 (1) Å, b=3.8013 (4) Å, c=9.4405 (7) Å, β=91.529 (7)° and d=4.249 g/cm³. In this sense, it is evident that $\lambda\text{-}Ti_3O_5$ of the fine structural body 1 of the present invention is different from $\beta\text{-}Ti_3O_5$ even in terms of crystal structure.

Further, it has been confirmed that the conventional crystals become crystal structural bodies of neither α phase nor β phase, within a significantly narrow temperature range around about 460K. An XRD pattern of such crystal structural bodies was then analyzed, and the peaks particular to the corresponding XRD pattern were marked with "*" in FIG. 4. As shown in FIG. 4, it was confirmed that those peaks were significantly identical to the peaks in the XRD pattern of $\lambda\text{-}Ti_3O_5$ of the present invention. In this sense, it became evident that the crystal structure of the fine structural body 1 of the present invention is allowed to stably become $\lambda\text{-}Ti_3O_5$ within the wide temperature range of about 0 to 300K, as compared to the conventional crystals whose crystal structures are allowed to become $\lambda\text{-}Ti_3O_5$ only within the significantly narrow temperature range around about 460K.

(3-2) Temperature dependence of β phase and α phase of fine structural body

Figure 7:
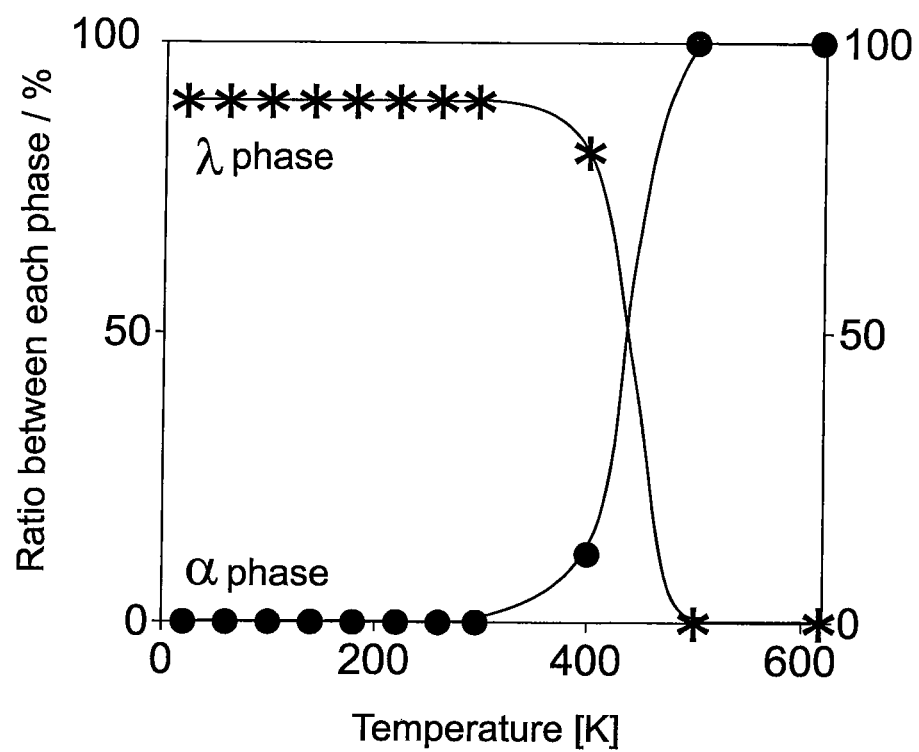
FIG. 7 is a graph showing a correlation between the temperature and a ratio between $\lambda$ phase and a phase of the fine structural body.

Here, with regard to the fine structural body 1 of the present invention, a ratio between α phase and β phase within a temperature range of 0 to 650K was studied based on the diffraction X-ray intensities of the XRD pattern, and there were obtained results shown in FIG. 7. Particularly, with regard to the fine structural body 1, there was manifested $\beta\text{-}Ti_3O_5$ by a certain percentage within the temperature range of 0 to 300K at the time of manufacturing. However, since the level of manifestation of $\beta\text{-}Ti_3O_5$ is slight as compared to that of $\lambda\text{-}Ti_3O_5$, only $\lambda\text{-}Ti_3O_5$ is focused here.

As shown in FIG. 7, it was confirmed that the crystal phase of the fine structural body 1 became λ phase within the temperature range equal to or lower than about 300K. Further, with regard to the fine structural body 1, it became evident that once the temperature had reached about 400K, α phase started to become present. Gradually, there were observed more α phases but less λ phases as the temperature increased. Furthermore, there were observed more α phases than λ phases as the temperature had exceeded about 400K, and was observed thereafter the mixed phase of λ phase and α phase before the temperature had reached about 500K. Furthermore, it became evident that the crystal phase of fine structural body 1 was only composed of α phase within the temperature range equal to or higher than about 500K.

Figure 8A:
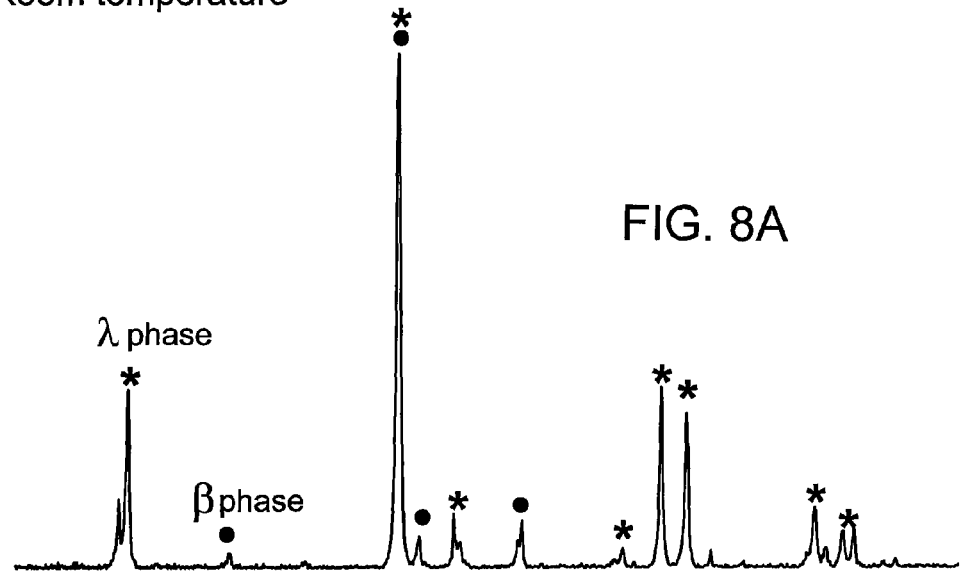
FIG. 8 is a set of graphs showing analysis results of XRD patterns of a $\lambda$-$Ti_3O_5$ powder sample before and after a heating treatment.
Figure 8B:
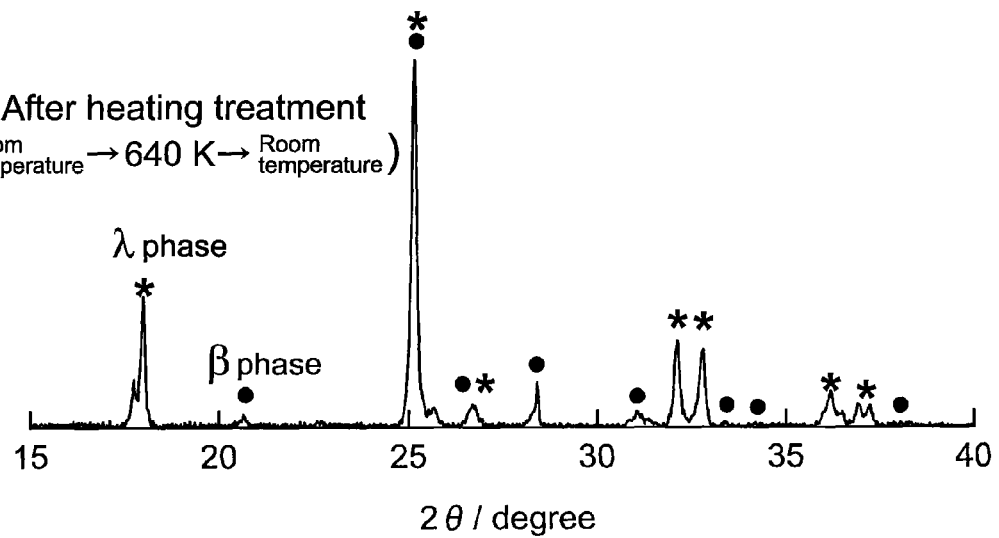

Further, the fine structural body 1 having an XRD pattern shown in FIG. 8A at room temperature was heated thereafter until the temperature had reached about 500K or higher (e.g., 640K) and there was only observed α phase accordingly. However, after being cooled to the room temperature again, it was confirmed that λ phase had reappeared, as shown in FIG. 8B. In this way, with regard to the fine structural body 1, it was confirmed that there was manifested λ phase within a wide temperature range higher than 0K but lower than 500K, and that manifestations of λ phase and α phase were dependent on the temperature.

(3-3) Magnetic property of fine structural body

Next, a magnetic property of the fine structural body 1 was studied by changing the temperature. Particularly, a magnetic susceptibility of the fine structural body 1 was measured using a magnetic fluxmeter employing SQUID (Superconducting Quantum Interference Device). In this way, there was obtained a result as indicated by curve c2 shown in FIG. 5. According to FIG. 5, the fine structural body 1 was Pauli-paramagnetic in all temperature ranges of 0 to 800K. In this sense, it became evident that the paramagnetic metal state of the fine structural body 1 was maintained.

In this way, unlike the conventionally-known bulk bodies having $Ti^{3+}$, the crystal structure of the fine structural body 1 was not phase-transited to $\beta$-$Ti_3O_5$, but to $\lambda$-$Ti_3O_5$, as the temperature was lowered to about 460K from a high temperature, and the fine structural body 1 was found to keep exhibiting the paramagnetic metal property similar to that of $\alpha$-$Ti_3O_5$ in all temperature ranges.

(3-4) Electric conductivity of fine structural body

Figure 9:
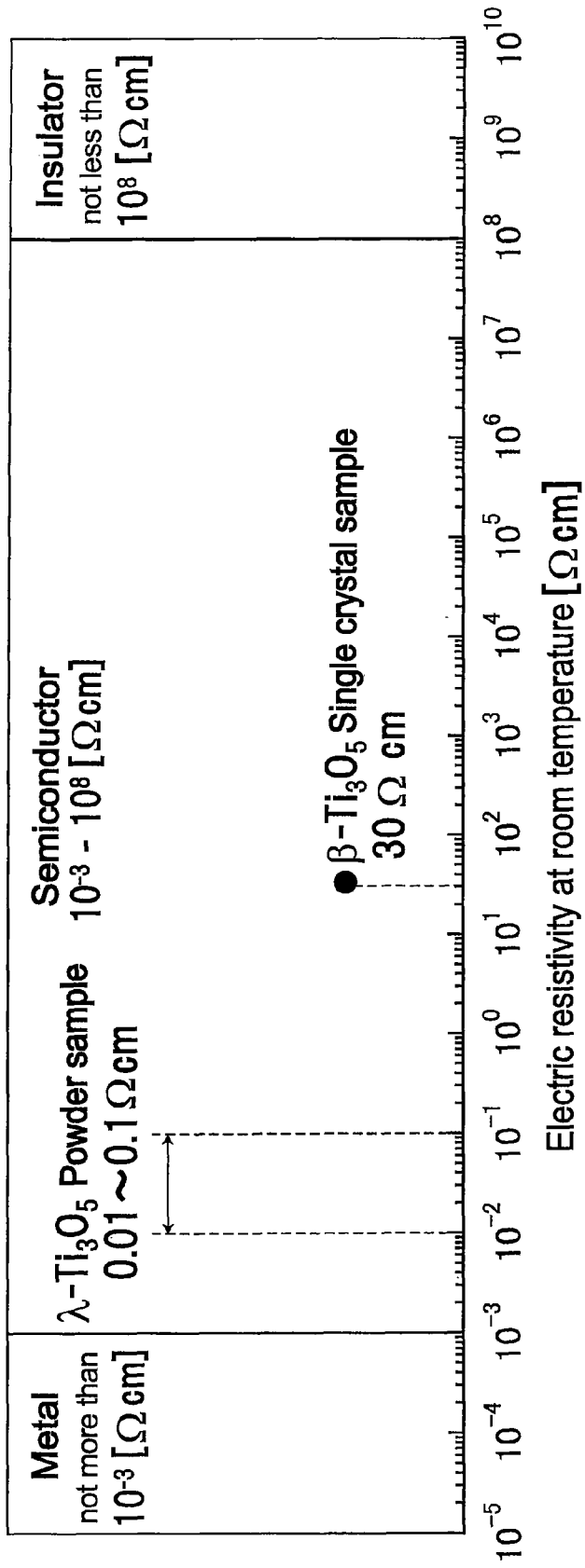
FIG. 9 is a graph showing electric resistivities of the $\lambda$-$Ti_3O_5$ powder sample and a $\beta$-$Ti_3O_5$ single crystal sample, at room temperature.

Next, an electric conductivity of the fine structural body 1 at room temperature was studied. In this case, there was prepared a powder sample composed of the fine structural body 1 (referred to as $\lambda$-$Ti_3O_5$ powder sample, hereunder), and an atomic force microscope (AFM) equipped with a conductive probe was used to measure the electric conductivity of the $\lambda$-$Ti_3O_5$ powder sample at room temperature. Here, in FIG. 9, a horizontal axis represents electric resistivities in which an electric resistivity less than or equal to about $10^{-3}$ [$\Omega$cm] indicates an electric conductivity of a metal, an electric resistivity greater than or equal to about $10^8$ [$\Omega$cm] indicates an electric conductivity of an insulator, and an electric resistivity greater than about $10^{-3}$ but less than $10^8$ [$\Omega$cm] indicates an electric conductivity of a semiconductor.

The electric conductivity of the $\lambda$-$Ti_3O_5$ powder sample was about 0.01 to 0.1 [$\Omega$cm]. In this sense, it became evident that the fine structural body 1 at room temperature (i.e., the fine structural body 1 having the crystal structure of $\lambda$-$Ti_3O_5$) had an electric conductivity close to that of a metal, even though the fine structural body 1 was a semiconductor. In addition, although not shown, $\alpha$-$Ti_3O_5$ manifested within a temperature range higher than or equal to 460K had an electric conductivity of about $10^{-1}$ to $10^{-2}$ [$\Omega$cm], which was significantly similar to those of $\lambda$-$Ti_3O_5$.

In contrast, a single crystal sample comprised of $\beta$-$Ti_3O_5$ (referred to as $\beta$-$Ti_3O_5$ single crystal sample, hereunder) had an electric conductivity of about 30 [$\Omega$m], which differed from that of the $\lambda$-$Ti_3O_5$ powder sample by three digits. Further, it was confirmed that the $\beta$-$Ti_3O_5$ single crystal sample could be considered as a nonmagnetic semiconductor as in contrast to the $\lambda$-$Ti_3O_5$ powder sample.

(3-5) Pressure effect of fine structural body

Figures 10A, 10B:
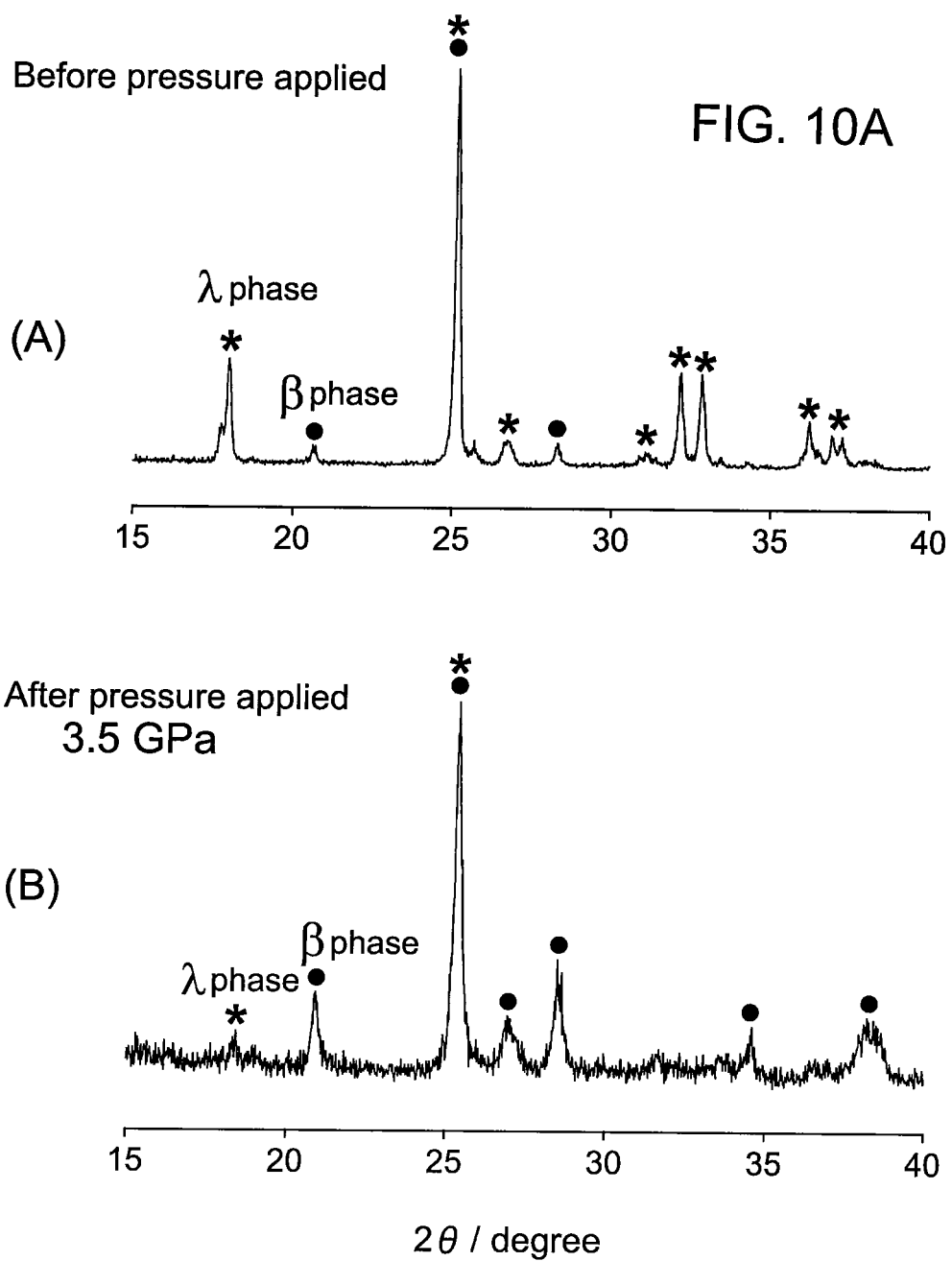
FIG. 10 is a set of graphs showing analysis results of XRD patterns of the $\lambda$-$Ti_3O_5$ powder sample before and after a pressure is applied thereto.

Next, there were measured an XRD pattern of the fine structural body 1 at room temperature before a pressure was applied thereto, and an XRD pattern of the fine structural body 1 at room temperature after a pressure of about 3.5 GPa had been applied thereto. Particularly, there was first prepared a pellet by applying the pressure of about 3.5 GPa to the $\lambda$-$Ti_3O_5$ powder sample, followed by measuring an XRD pattern of such $\lambda$-$Ti_3O_5$ pellet sample under atmospheric pressure. As a result and as shown in FIG. 10A, with regard to the $\lambda$-$Ti_3O_5$ powder sample before being subjected to the pressure, the locations of the peaks in the XRD pattern thereof were identical to those in the XRD pattern of $\lambda$-$Ti_3O_5$. Accordingly, it was confirmed that the $\lambda$-$Ti_3O_5$ powder sample was $\lambda$ phase.

Next, as shown in FIG. 10B, with regard to the $\lambda$-$Ti_3O_5$ pellet sample subjected to the pressure of about 3.5 GPa, the locations of the peaks in the XRD pattern thereof were partially identical to those in the XRD pattern of $\lambda$-$Ti_3O_5$, but were significantly identical to those in the XRD pattern of $\beta$-$Ti_3O_5$. In this sense, it was confirmed that the $\lambda$-$Ti_3O_5$ powder sample composed of the fine structural body 1 of the present invention had allowed the crystal structure thereof to partially undergo phase transition from $\lambda$ phase to $\beta$ phase, when subjected to the pressure.

Figure 11:
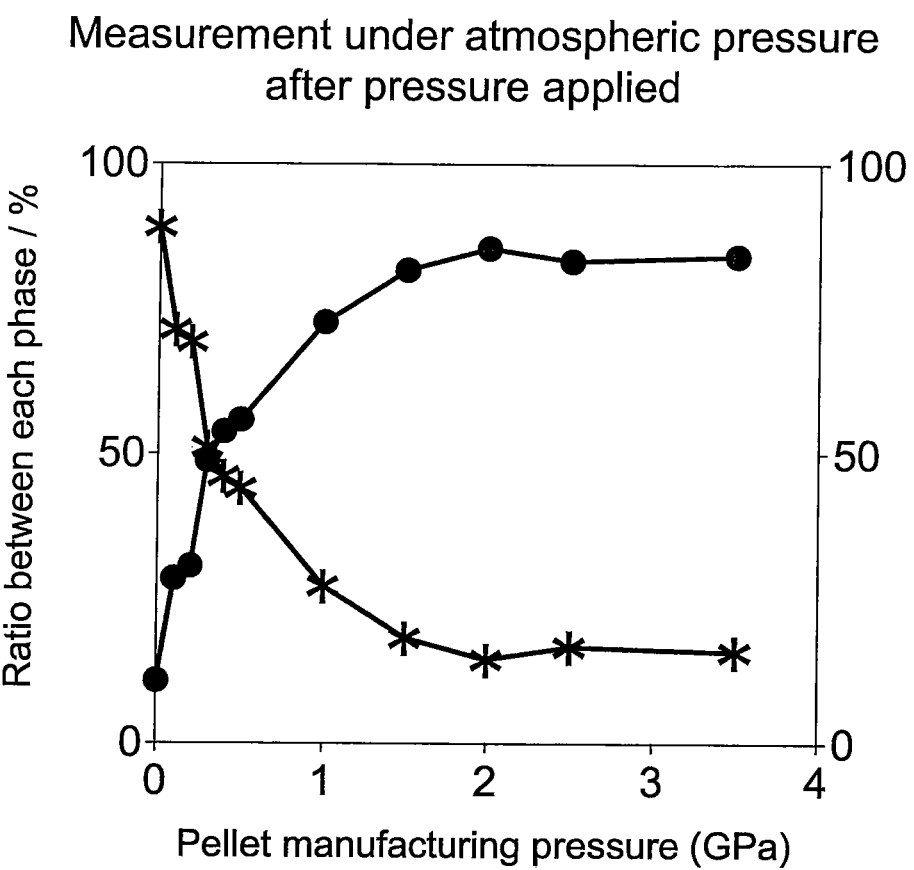
FIG. 11 is a graph showing a correlation between the pressure applied and a ratio between $\lambda$ phase and $\beta$ phase of the $\lambda$-$Ti_3O_5$ powder sample.

Next, there was studied a correlation between the pressure applied to the $\lambda$-$Ti_3O_5$ powder sample at room temperature, and a ratio between $\lambda$ phase and $\beta$ phase of the $\lambda$-$Ti_3O_5$ powder sample, and there was obtained a result as shown in FIG. 11. Particularly, the pressure applied to the $\lambda$-$Ti_3O_5$ powder sample at room temperature was gradually increased, thus preparing a pellet sample. Subsequently, there was measured, under atmospheric pressure, an XRD pattern of the $\lambda$-$Ti_3O_5$ pellet sample prepared with a given applied pressure, and the ratio between $\lambda$ phase and $\beta$ phase was studied based on the diffraction X-ray intensities of the XRD pattern thus measured. As shown in FIG. 11, it was confirmed that the fine structural body 1 had undergone phase transition from $\lambda$ phase to $\beta$ phase even when subjected to a relatively weak pressure. Further, with regard to the fine structural body 1, it was confirmed that the ratio of $\beta$ phase to $\lambda$ phase had gradually increased as the applied pressure was increased.

Further, heat was applied to the pellet sample partially phase-transited to $\beta$ phase after being subjected to the pressure, and an XRD pattern at that time was measured, followed by studying the crystal phase based on the diffraction X-ray intensities of the XRD pattern thus measured. As a result, it was confirmed that the pellet sample partially phase-transited to $\beta$ phase after being subjected to the pressure, had undergone phase transition from $\lambda$ phase and $\beta$ phase to $\alpha$ phase within a temperature range higher than or equal to about 460K, as the temperature was increased via heating.

Figure 12A:
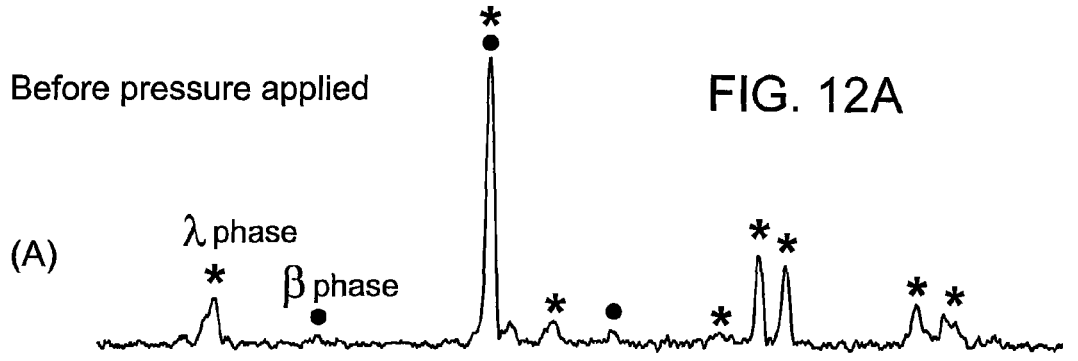
FIG. 12 is a series of graphs showing analysis results of XRD patterns of the $\lambda$-$Ti_3O_5$ powder sample before and after the pressure is applied thereto, and after the heating treatment.
Figure 12B:
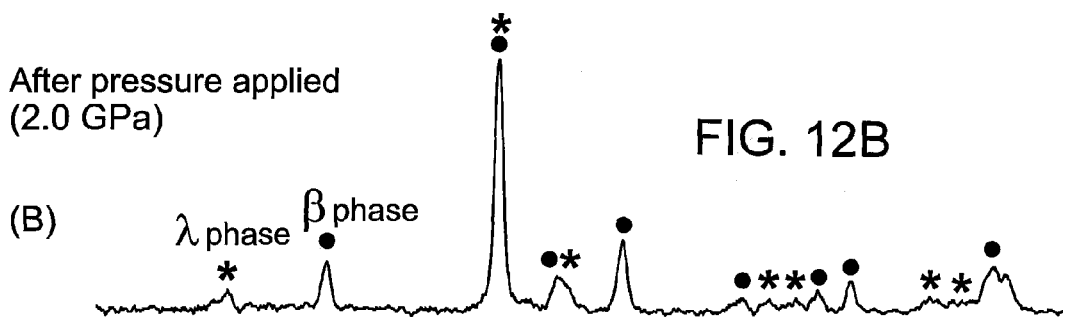
Figure 12C:
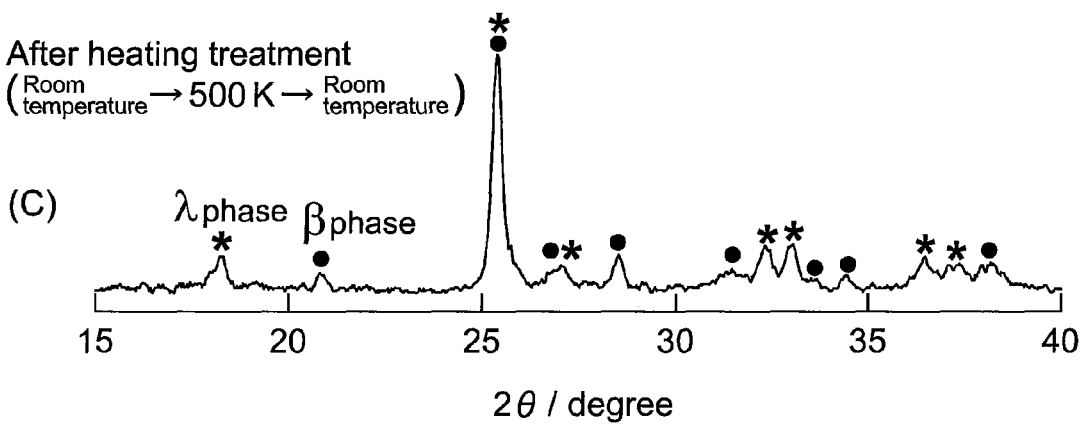

Next, a pressure of about 2.0 GPa was applied to a pellet sample not yet subjected to the pressure and having an XRD pattern shown in FIG. 12A, thereby preparing a pellet sample having an XRD pattern shown in FIG. 12B. Subsequently, the pellet sample thus prepared was heated at about 500K, and caused to undergo phase transition from $\lambda$ phase and $\beta$ phase to $\alpha$ phase, followed by cooling such pellet sample so as to measure an XRD pattern thereof, thus obtaining a result shown in FIG. 12C. As shown in FIG. 12C, it was confirmed that the pellet sample thus transited to $\alpha$ phase had again been phase-transited to $\beta$ phase as the temperature was lowered again via cooling. In this sense, the crystal structure of the fine structural body 1 of the present invention undergoes phase transition from $\lambda$ phase to $\beta$ phase when subjected to a pressure, and undergoes phase transition from $\beta$ phase to $\alpha$ phase and then from $\alpha$ phase to $\lambda$ phase again as the temperature is changed.

(3-6) Light irradiation effect on fine structural body

Next, there were measured an XRD pattern of the fine structural body 1 before a light was irradiated thereon at room temperature, and an XRD pattern of the fine structural body 1 after the light had been irradiated thereon at room temperature. Particularly, there was first prepared a black pellet sample as thick as about 1 to 2 mm by applying a pressure of 0.1 GPa to the $\lambda$-$Ti_3O_5$ powder sample. Here, although almost no $\beta$ phase had been observed in the $\lambda$-$Ti_3O_5$ powder sample before preparing the pellet sample, there was slightly manifested $\beta$ phase in the $\lambda$-$Ti_3O_5$ powder sample after preparing the pellet sample, since the pressure had been applied when preparing the pellet sample.

Figures 13A, 13B:
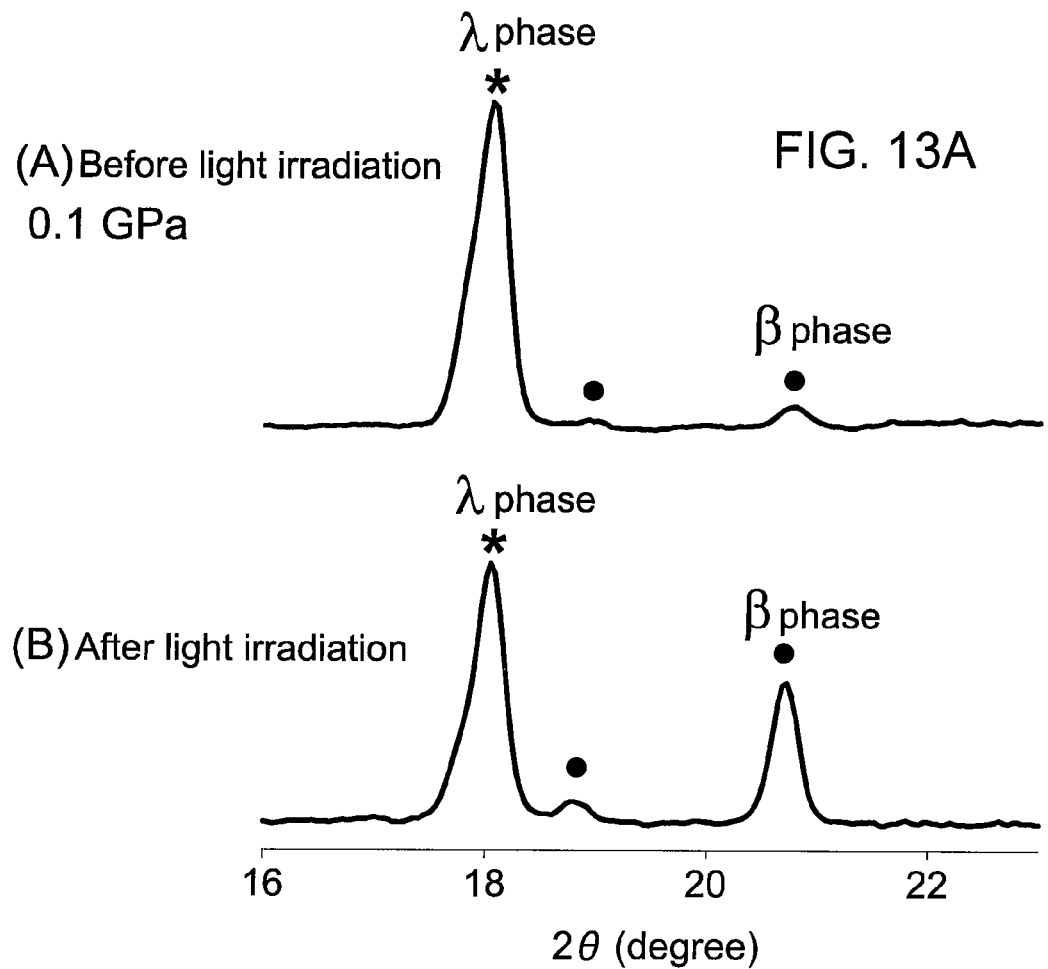
FIG. 13 is a set of graphs showing analysis results of XRD patterns of the $\lambda$-$Ti_3O_5$ powder sample before and after irradiation with a pulse laser beam.
Figure 14:
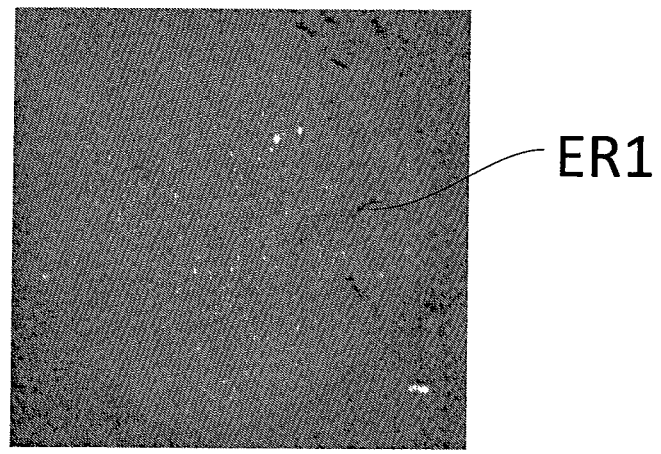
FIG. 14 is a picture showing a change in a color phase of the $\lambda$-$Ti_3O_5$ powder sample after irradiation with the pulse laser beam.

An XRD pattern of such pellet sample was measured. Further, a pulse laser beam of 532 nm was irradiated on this pellet sample, followed by measuring an XRD pattern of the pellet sample thus irradiated. Here, FIGS. 13A and B show analysis results of XRD spectrums, in which FIG. 13A shows the XRD pattern of the pellet sample before being irradiated with the pulse laser beam, and FIG. 13B shows the XRD pattern of the pellet sample after being irradiated with the pulse laser beam. According to the analysis results shown in FIGS. 13A and B, it was confirmed that $\lambda$ phase was observed less, while β phase was observed more in the pellet sample that had been irradiated with the pulse laser beam. Accordingly, it was confirmed that the fine structural body 1 of the present invention has a feature in which photoinduced phase transition from λ phase to β phase takes place at room temperature.

In addition, the powder sample partially phase-transited to β phase after being irradiated with the pulse laser beam is allowed to undergo phase transition from λ phase and β phase to λ phase within a temperature range higher than or equal to about 460K, as the temperature is increased via heating as mentioned above. Such powder sample is further allowed to undergo phase transition from a phase to λ phase again as the temperature is lowered again thereafter via cooling. Further, although lights from various lamps such as a mercury lamp or the like can be employed as the lights with which the pellet sample is irradiated, it was confirmed that the crystal structure underwent photoinduced phase transition most significantly when irradiated with the pulse laser beam of 532 nm.

Here, there was made a comparison between outer appearances of the λ-$Ti_3O_5$ powder sample before being irradiated with the pulse laser beam and the λ-$Ti_3O_5$ powder sample after being irradiated with the pulse laser beam. Particularly, the pulse laser beam of 532 nm was irradiated on the λ-$Ti_3O_5$ powder sample, and an observation was made on a portion of the λ-$Ti_3O_5$ powder sample on which the corresponding pulse laser beam was irradiated. As a result, it was confirmed that although the λ-$Ti_3O_5$ powder sample was black before being irradiated with the pulse laser beam, an irradiated portion ER1 thereof on which the pulse laser beam was irradiated had turned from black to brown after being irradiated with the corresponding pulse laser beam. In addition, the irradiated portion ER1 that had turned brown was β-$Ti_3O_5$.

(4) Operations and effects

According to the present invention having the aforementioned structure, the powder body 3 composed of the nano-sized $TiO_2$ particles having the crystal structures of the anatase type, is subjected to the baking treatment for an hour or longer, in the hydrogen atmosphere of 0.1 L/min or more and at the temperature of about 1100° C. to 1400° C. In this way, according to this manufacturing method, there can be manufactured the fine structural body 1 having the crystal structure comprised of $Ti_3O_5$ and turning into λ phase in a low temperature range and a phase in a high temperature range.

Unlike the conventional crystals, the fine structural body 1 manufactured according to this manufacturing method does not undergo phase transition to β phase having the property of a nonmagnetic semiconductor, even when the temperature is equal to or lower than 460K as the temperature is lowered from a high temperature. Instead, the fine structural body 1 undergoes phase transition to λ phase that is the monoclinic crystal phase in which the paramagnetic metal state is maintained, thus consistently maintaining the property of a paramagnetic metal even within a low temperature range lower than or equal to 460K.

Accordingly, unlike the conventional bulk bodies phase-transited between nonmagnetic semiconductors and paramagnetic metals around about 460K, there can be provided a fine structural body 1 capable of manifesting an unprecedented property in which the composition of $Ti_3O_5$ allows the paramagnetic metal property to be consistently maintained in all temperature ranges of 0 to 800K.

Further, the fine structural body 1 allows the crystal structure thereof to undergo phase transition from λ-$Ti_3O_5$ to β-$Ti_3O_5$ when subjected to a pressure at room temperature. Furthermore, the ratio of β phase to λ phase gradually increases as the applied pressure is increased, thus allowing the ratio between λ phase and β phase to be adjusted by adjusting the pressure applied. Furthermore, even after being phase-transited to β phase due to the pressure applied, the fine structural body 1, when applied with heat, is allowed to undergo phase transition from β phase and remaining λ phase to α phase within the temperature range higher than or equal to about 460K. Furthermore, even when the fine structural body 1 has been phased-transited to α phase by increasing the temperature, lowering the temperature via cooling allows such fine structural body 1 to be phase-transited to λ phase again from α phase.

Furthermore, the fine structural body 1 allows the crystal structure thereof to undergo phase transition from λ-$Ti_3O_5$ to β-$Ti_3O_5$ after being irradiated with the pulse laser beam at room temperature. Furthermore, even in this case, the fine structural body 1 is allowed to undergo phase transition from λ phase and β phase to a phase within the temperature range higher than or equal to about 460K, as the temperature is increased via heating. And, the phase transition from α phase to λ phase again is allowed to take place as the temperature is lowered via cooling.

Further, the fine structural body 1 is only comprised of Ti which is highly safe and inexpensive, thus making it possible to provide the fine structural body 1 with a low price, as a whole.

(5) Applications of fine structural body

Figure 15:
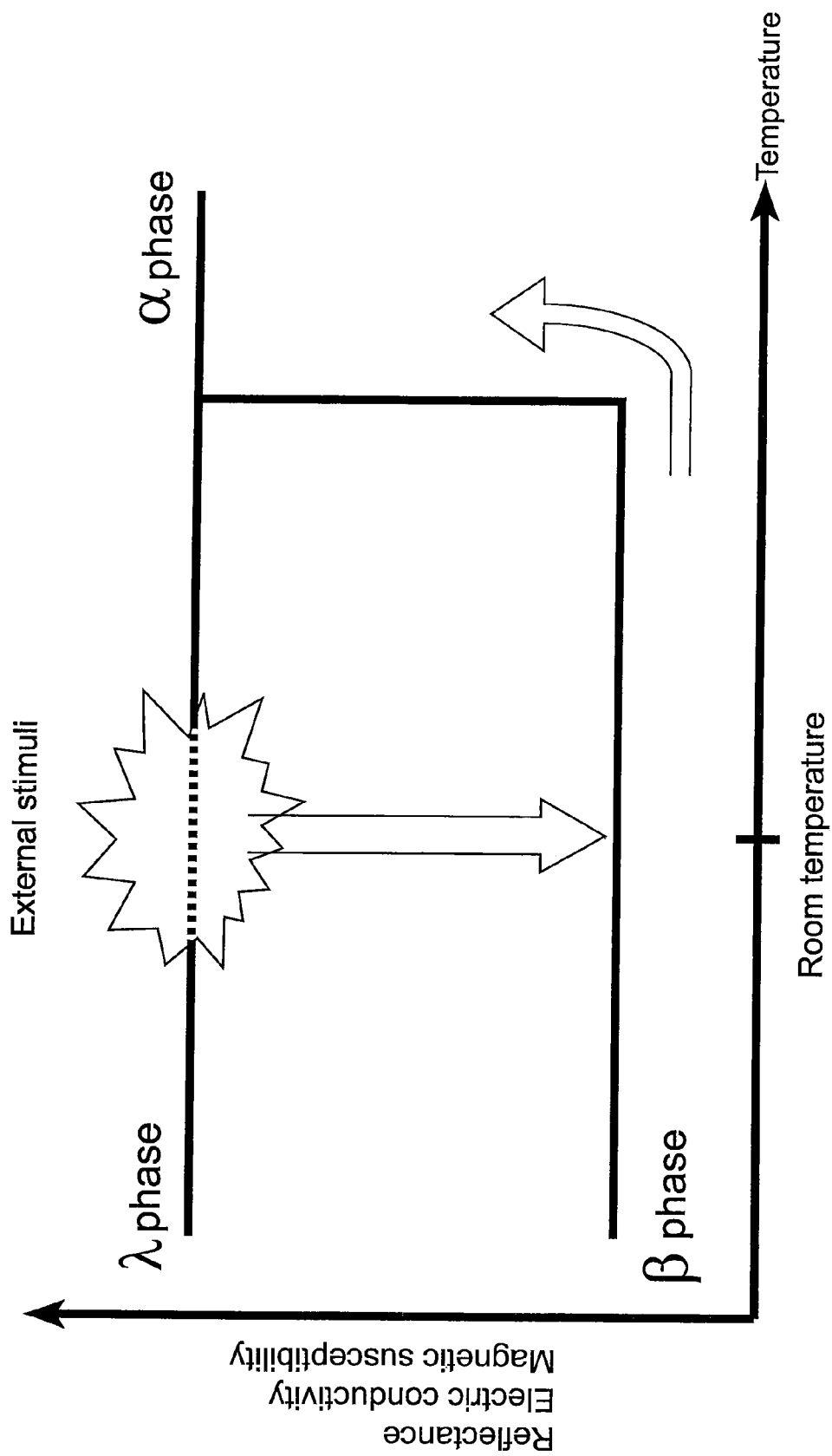
FIG. 15 is a graph used to explain intended purposes of the fine structural body.

The fine structural body 1 can be used for the following purposes, based on an optical property, an electric conduction property and a magnetic property thereof. As shown in FIG. 15, the fine structural body 1 of the present invention has the crystal structure of λ phase having the paramagnetic metal property, when the temperature is below about 460K. Further, the crystal structure of the fine structural body 1 is changed to that of β phase having the property of a nonmagnetic semiconductor, when subjected to an external stimulus such as a light, a pressure, an electromagnetic force, a magnetic field or the like, thus allowing the magnetic property of the fine structural body 1 to be changed.

Here, in FIG. 15, a horizontal axis represents the temperature, while a vertical axis represents magnetic susceptibility, electric conductivity or reflectance. According to the fine structural body 1 of the present invention, the paramagnetic metal state thereof is maintained through out the low-temperature range and the high-temperature range, thus allowing an electric conductivity, a magnetic susceptibility and a reflectance of the fine structural body 1 to be maintained relatively high. In contrast, β phase resulting from changes in the crystal structure due to the external stimulus has the property of a nonmagnetic semiconductor, thus causing the magnetic susceptibility, the electric conductivity and the reflectance to become lower than those of α phase and λ phase. In this sense, the electric resistance, the magnetic susceptibility and the reflectance of the fine structural body 1 can be changed due to the external stimulus.

Further, even if the fine structural body 1 is changed to β phase when subjected to the external stimulus, the crystal structure thereof can be changed to that of α phase having the paramagnetic metal property by raising the temperature. Subsequently, as the temperature is lowered, the crystal structure of the fine structural body 1 can be changed to that of λ phase again from that of α phase. Accordingly, the fine structural body 1 has a feature in which the crystal structure thereof is allowed to be changed from that of λ phase to that of β phase due to the external stimulus, and from that of β phase to that of α phase, and then from that of α phase to that of λ phase again due to the changes in the temperature. Because of this feature, the fine structural body 1 can be used in optical switching, magnetic memories, charge storage memories, optical information recoding media or the like.

Optical information recording media employing the fine structural body 1 of the present invention are low in toxicity and can contribute to cost reduction, because there is used titanium oxide instead of substances such as germanium, antimony, tellurium or the like used in Blu-ray Discs, for example. Such optical information recoding media are described later in detail.

Particularly, a given light serving as an external stimulus is applied to the fine structural body 1 at room temperature, thereby allowing the crystal structure thereof to change to that of β phase with the property of a nonmagnetic semiconductor from that of λ phase with the paramagnetic metal property, thus allowing the fine structural body 1 to be used in optical switching.

Further, an external stimulus such as a light, a pressure, an electromagnetic force and a magnetic field is applied to the fine structural body 1 at room temperature, thereby allowing the crystal structure of the fine structural body 1 to change to that of β phase with the property of a nonmagnetic semiconductor from that of λ phase with the paramagnetic metal property, thus allowing the fine structural body 1 to be used in magnetic memories.

In fact, when used in magnetic memories, the fine structural body 1 is employed as a magnetic material, and there is formed a magnetic layer obtained by fixing such magnetic material on a supporting body. With regard to magnetic memories, external stimulus such as a light, a pressure, an electric field and a magnetic field is applied thereto, thereby changing the magnetic property thereof by causing the crystal structure to change to $β$-$Ti_3O_5$ with the property of a nonmagnetic semiconductor from $λ$-$Ti_3O_5$ with the paramagnetic metal property, thus allowing information to be recorded. In this way, with regard to magnetic memories, stored information can be retrieved based on, for example, changes in the reflectance of a laser beam irradiated on the magnetic layer. Therefore, there can be provided a magnetic memory employing the fine structural body 1 as the magnetic material.

Further, when there is dispersed in an insulator the fine structural body 1 having such electric conduction property, electric charges can be moved through the hopping conduction and the tunneling conduction due to the fine structural body 1. Accordingly, the fine structural body 1 can be used in a charge storage layer such as a floating gate of a charge storage memory such as a flash memory or the like. Therefore, there can be provided a charge storage memory employing a charge storage layer using the fine structural body 1 as a charge storage material.

Furthermore, since the fine structural body 1 itself has the magnetic property and the electric conduction property, there is obtained a new magnetoelectric (ME) effect, thus allowing the fine structural body 1 to be used in technologies employing the ME effect. Furthermore, due to a coupling of the aforementioned optical property and electric conduction property, the fine structural body 1 can also be used in fast switching effected by transient photocurrent.

(6) Photoinduced phase transition phenomenon of fine structural body

Next, further verifications were made on the aforementioned "(3-6) Light irradiation effect on fine structural body." Here, as shown in FIG. 16A, there was prepared a black sample having a crystal structure of λ phase. Subsequently, the pulse laser beam of 532 nm ($Nd^{3+}$ YAG laser) was irradiated on this sample, and there were made observations on a portion subjected to a given optical intensity due to the corresponding pulse laser beam. In this case, the irradiated portion of the aforementioned black sample subjected to the pulse laser beam turned from black to brown indicating β phase (FIG. 16B).

Next, a CW (Continuous Wave) laser beam of 410 nm that was a continuous laser beam was further irradiated on this sample, and there were made observations on a portion subjected to the corresponding CW laser beam. As a result and as shown in FIG. 16C, it was confirmed that an irradiated portion of the sample subjected to the CW laser beam had turned from brown indicating β phase to a color close to the original black. Further, the CW laser beam of 410 nm was irradiated on another portion of the sample for the sake of confirmation, and it was confirmed, as shown in FIG. 16D, that this irradiated portion subjected to the corresponding CW laser beam had likewise turned from brown indicating β phase to a color close to the original black.

Next, the pulse laser beam of 532 nm was again irradiated on this sample in the manner as described above, and there were made observations on a portion subjected to the corresponding pulse laser beam. As a result and as shown in FIG. 16E, it was confirmed that an irradiated portion subjected to the pulse laser beam had turned back from black to brown indicating β phase again, i.e. the state shown in FIG. 16B.

In this way, the CW laser beam of 410 nm and the pulse laser beam of 532 mn were repeatedly irradiated on the sample, and it was confirmed, as shown in FIG. 16F through FIG. 16I, that the aforementioned changes in the color of the sample were observed interchangeably and repeatedly every time either the CW laser beam or the pulse laser beam was irradiated on the sample. Thus, there was confirmed a photoinduced phase transition phenomenon of the fine structural body.

Next, the pulse laser beam of 532 nm was irradiated on the sample in a shot-by-shot fashion (1 shot each time) so as to repeatedly apply the given optical intensity thereto. After analyzing XRD patterns at that time, there were obtained results shown in FIG. 17A through FIG. 17D. According to the analysis results of the XRD patterns (differential patterns obtained from the XRD patterns before and after the irradiation with the pulse laser beam) shown in FIG. 17A through FIG. 17D, phase transitions from λ phase to β phase and from β phase to λ phase were interchangeably and repeatedly confirmed upon each shot of the pulse laser beam (1 shot each time). Further, such phenomenon was also observed with a light of 355 to 1064 nm, and it was confirmed that switching (phase transition) via light irradiation was possible even with a light beam of single wavelength.

(7) Thermodynamic analysis of fine structural body

Here, in order to comprehend a production mechanism of $λ$-$Ti_3O_5$, the Slichter and Drickamer model that is a model of mean field theory was used to calculate the Gibbs free energy versus the fraction (x) of charge-delocalized unit.

Figure 18:
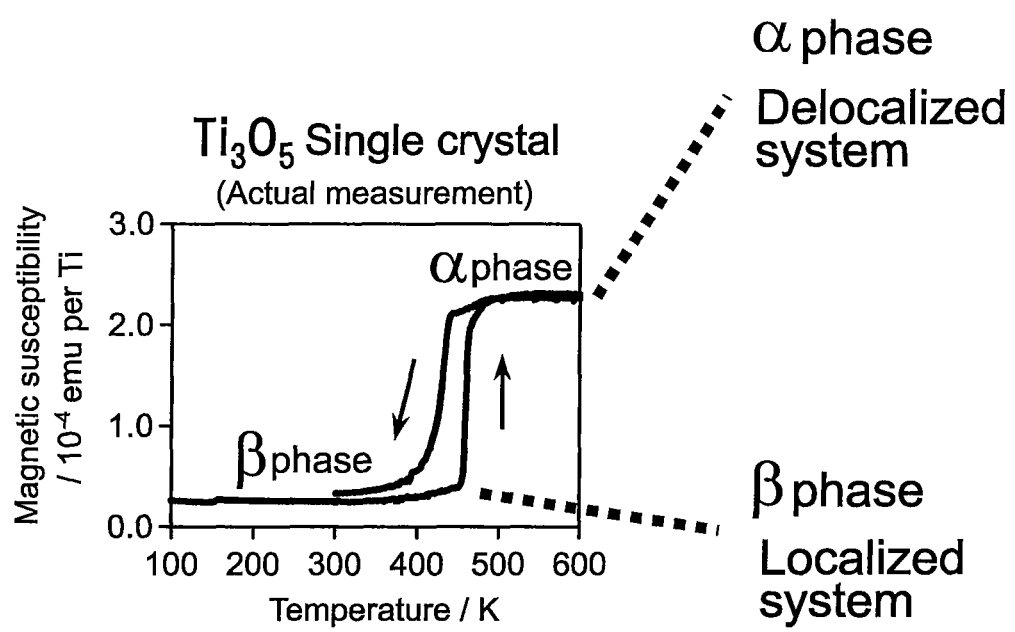
FIG. 18 is a graph showing phase transitions between $\beta$ phase and a phase, due to the temperature change of a $Ti_3O_5$ single crystal.

Here, as shown in FIG. 18, with regard to the conventional crystals ($Ti_3O_5$ single crystals) whose crystal structures become $β$-$Ti_3O_5$ (β phase) when the temperature is below about 460K, the first-order phase transition between β phase and α phase (a semiconductor and a metal) was regarded as the phase transition between the charge-localized system (simply referred to as localized system in FIG. 18) and the charge-delocalized system (simply referred to as delocalized system in FIG. 18). Accordingly, the fraction (x) between the charge-localized unit ($Ti^{3+}Ti^{4+}Ti^{3+}O_5$) and the charge-delocalized unit ($((Ti)^{3.1/3+})_3O_5$) was considered as an order parameter. Here, the Gibbs free energy G related to the phase transition between β phase and a phase is expressed as the following formula 1

$$G = x\Delta H + \gamma x(1-x) + T\{R[x\ln x + (1-x)\ln(1-x)] - x\Delta S\}$$ [Formula 1]

In this case, the Gibbs free energy G of β phase (charge-localized system) serves as the reference of energy, x is the fraction of the charge-delocalized unit, ΔH is an enthalpy of transition, ΔS is an entropy of transition, R is a gas constant, γ is an interaction parameter and T is the temperature.

Figure 19A:
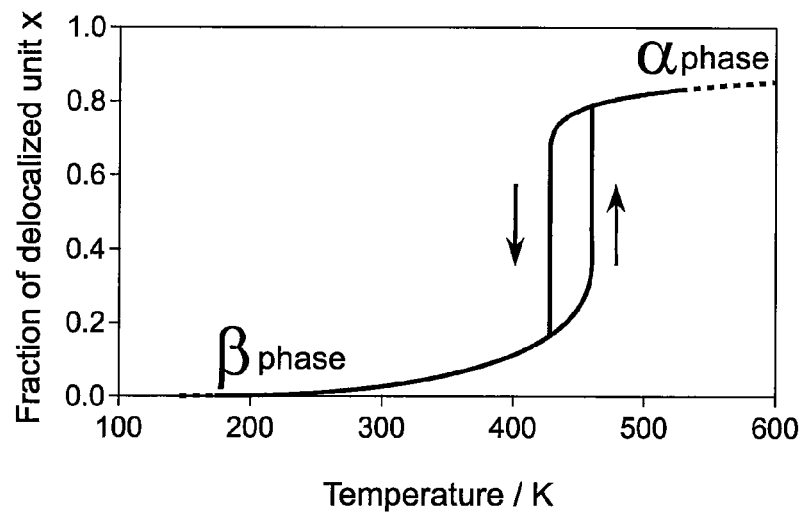
FIG. 19 is a set of schematic diagrams showing a correlation between a fraction of charge-delocalized unit and temperature of the $Ti_3O_5$ single crystal, and a correlation between a Gibbs free energy and fraction of the charge-delocalized unit of the $Ti_3O_5$ single crystal.
Figure 19B:
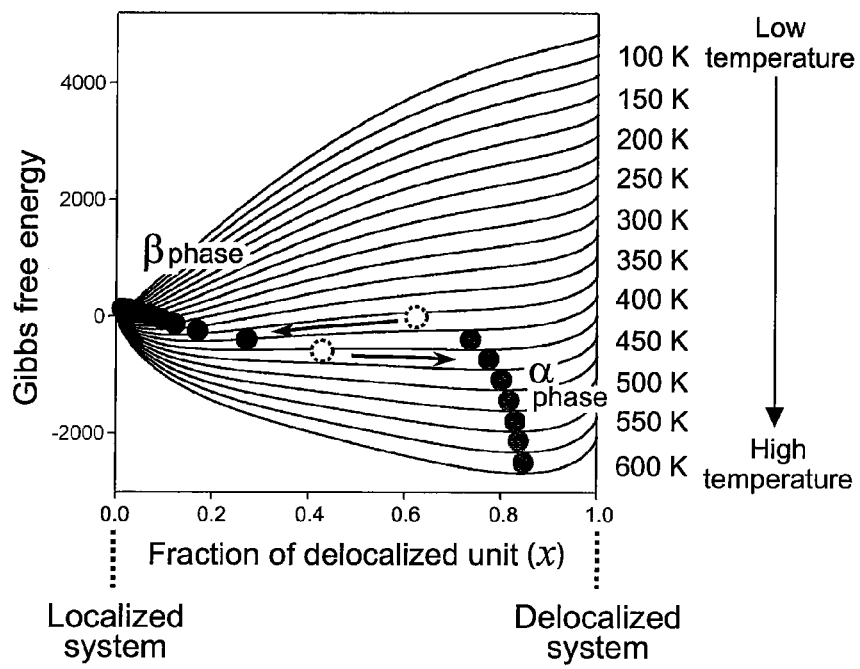

It has been reported that the enthalpy of transition ΔH between α phase and β phase is approximately 13 kJ mol$^{-1}$, and that the entropy of transition ΔS therebetween is approximately 29 J K$^{-1}$mol$^{-1}$. Next, the Gibbs free energy G was calculated using these values, followed by studying correlations among the Gibbs free energy G, the fraction (x) of the charge-delocalized unit and the temperature. As a result, there were confirmed correlations shown in FIG. 19A and FIG. 19B.

In contrast, the comprehension of nanosized λ-Ti$_3$O$_5$ is required for calculating a plot of the Gibbs free energy G of λ-Ti$_3$O$_5$ and a plot of the fraction (x) of the charge-delocalized unit of λ-Ti$_3$O$_5$. Here, a pressure effect in this system was utilized to measure the enthalpy of transition ΔH and entropy of transition ΔS of λ-Ti$_3$O$_5$. Here, λ-Ti$_3$O$_5$ (λ phase) was partially phase-transited to β-Ti$_3$O$_5$ (β phase) when subjected to a pressure. Next, the enthalpy of transition ΔH and entropy of transition ΔS from β phase to α phase were obtained by performing the DSC measurement on the sample partially phase-transited to β phase from λ phase. As a result, the enthalpy of transition ΔH from β phase to α phase was approximately 5 kJ mol$^{-1}$, and the entropy of transition ΔS from β phase to α phase was approximately 11 J K$^{-1}$mol$^{-1}$. Such values were smaller than those of the bulk bodies comprised of Ti$_3$O$_5$.

Figure 20A:
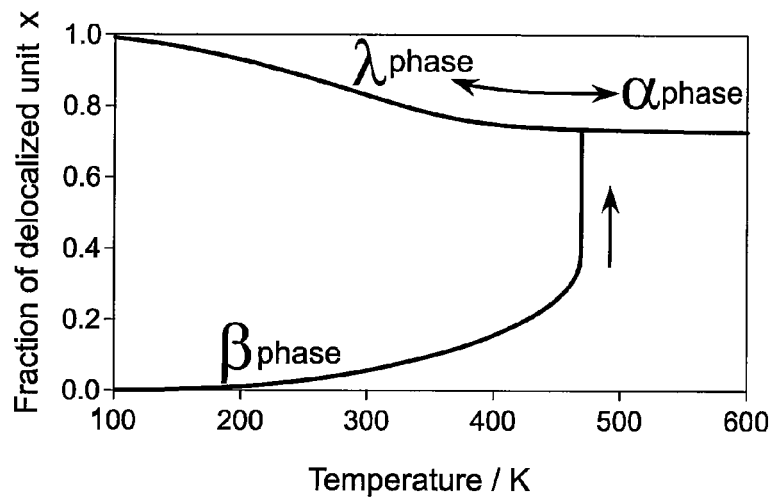
FIG. 20 is a set of schematic diagrams showing a correlation between a fraction of charge-delocalized unit and temperature of the sample of the present invention composed of $\lambda$ phase, and a correlation between such fraction of charge-delocalized unit and a Gibbs free energy of the sample of the present invention composed of $\lambda$ phase.
Figure 20B:
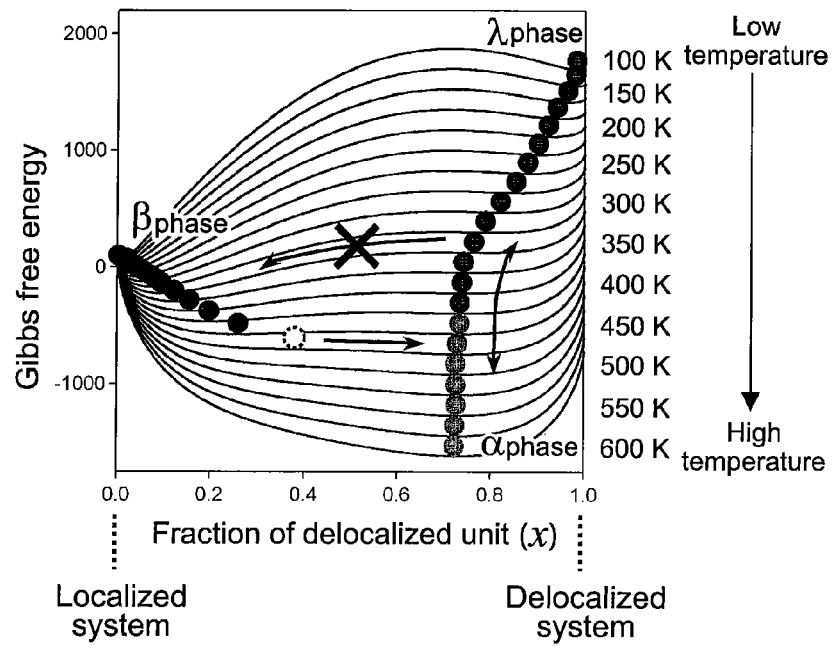
Figure 21:
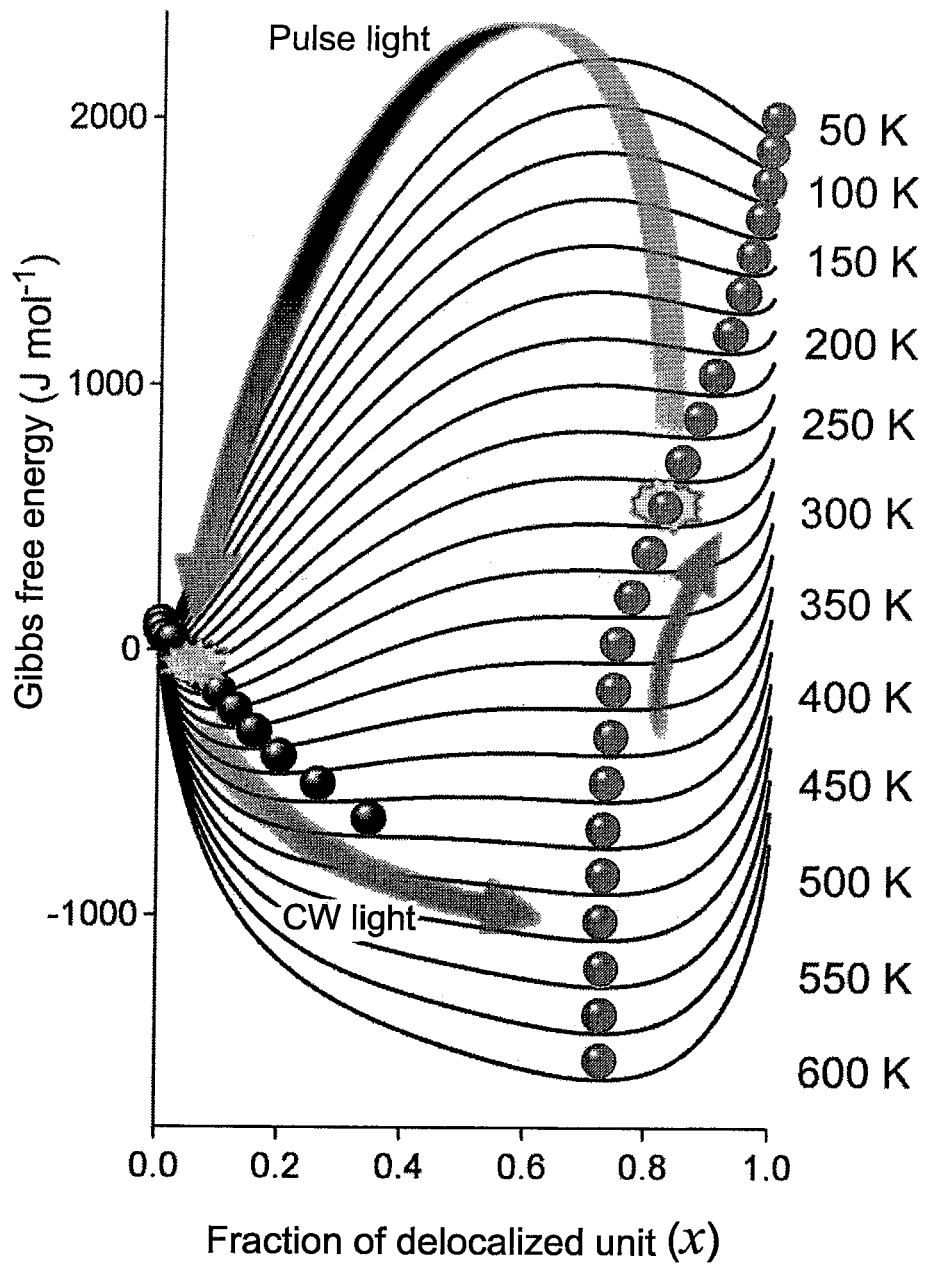
FIG. 21 is a graph showing a correlation between the Gibbs free energy and the fraction of charge-delocalized unit.

Next, the Gibbs free energy G was calculated using these values and the aforementioned formula 1, followed by studying correlations among the Gibbs free energy G, the fraction (x) of the charge-delocalized unit and the temperature. As a result, there were confirmed correlations shown in FIG. 20A and FIG. 20B. Here, according to FIG. 20B and with regard to λ-Ti$_3$O$_5$, it was confirmed that an energy barrier existed between the charge-localized system (primarily, β phase) and the charge-delocalized system (primarily, α phase and λ phase) in all temperature ranges. Because of this energy barrier, λ-Ti$_3$O$_5$ phase-transited to a phase is not phase-transited to β phase even after the temperature has been lowered, thus well explaining the temperature dependence of the nanosized crystals of λ-Ti$_3$O$_5$. As shown in FIG. 21, an external stimulus such as a pulsed light, a CW light or the like is required to overcome the energy barrier, and thus allow λ phase to be transited to β phase, and β phase to be transited to α phase. Further, according to FIG. 20A and FIG. 20B, it is evident that β phase is a truly stable phase when the temperature is lower than or equal to 460K in the state of thermal equilibrium.

Based on such thermodynamic analysis, it is conceivable that the photoinduced phase transition phenomenon in the present invention was caused by a phase collapse in which the seemingly stable λ phase was transited to the truly stable β phase after being irradiated with the pulse laser beam of 532 nm. Here, since the optical absorption in λ phase is metallic absorption, it is assumed that an ultraviolet light to a near-infrared light (a laser beam of 355 to 1064 nm) are effective in causing such metal-semiconductor transition.

Meanwhile, the returning reaction from α phase to λ phase is assumed to be caused by a light-heat process. It became evident that the reversed photoinduced phase transition from β phase to λ phase was caused by excitation from a d-orbital of Ti to another d-orbital thereof in the bandgap of β phase, and that, later, β phase was either directly phase-transited to λ phase or phase-transited to λ phase via rapid cooling after first being phase-transited to α phase via thermal heating.

Figure 22:
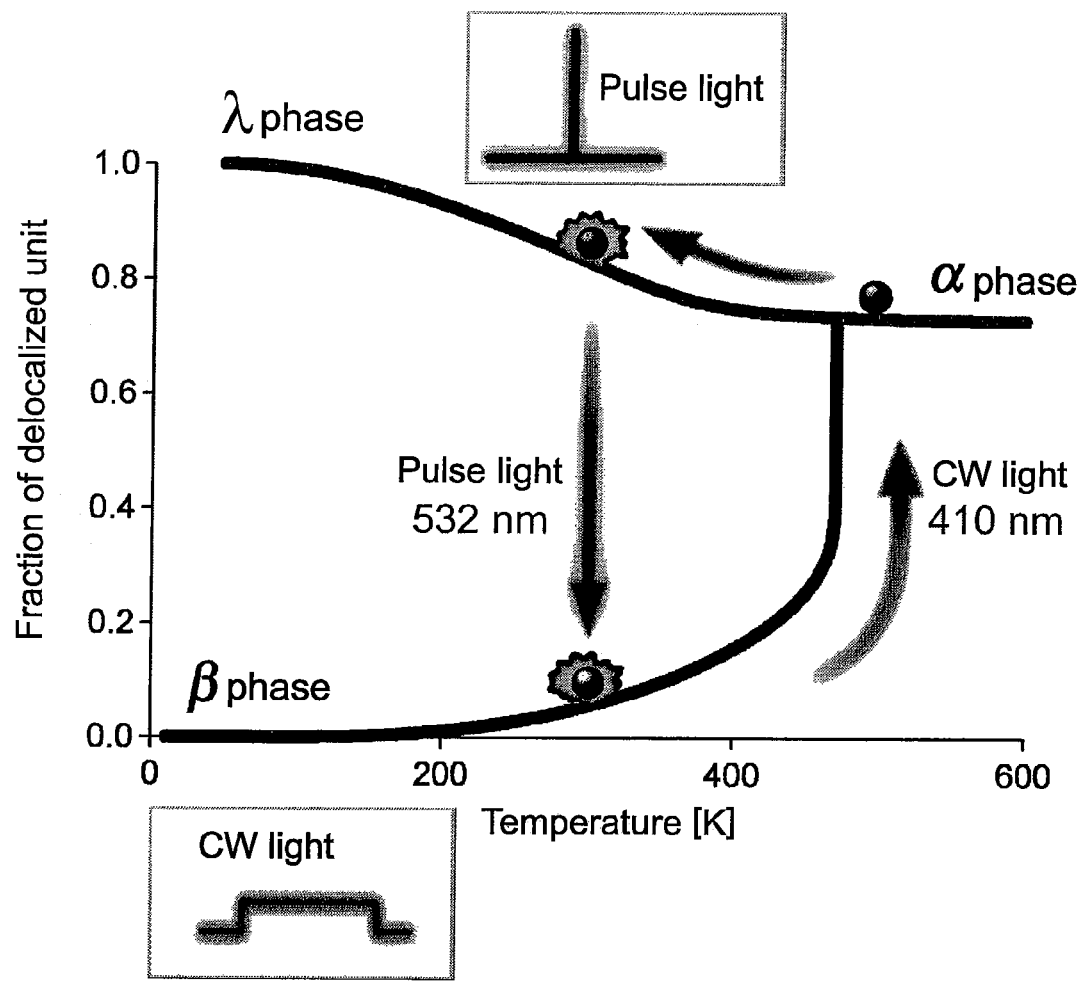
FIG. 22 is a graph showing a correlation between the fraction of charge-delocalized unit and the temperature at the time of light irradiation.

(8) Optical information recording media using fine structural body in recording layer As shown in FIG. 22, the fine structural body 1 of the present invention has a feature in which the crystal structure thereof undergoes phase transition from λ phase to β phase when subjected to the pulse light, from β phase to α phase when subjected to the CW light, and then from α phase to λ phase again as the temperature is lowered. In this sense, the fine structural body 1 can be used in a recording layer of an optical information recording medium such as a CD (Compact Disc), a DVD (Digital Versatile Disc), a Blu-ray Disc (registered trademark, referred to as BD, hereunder) or the like. The optical information recording medium in this case is capable of performing the three steps including formatting the recording layer thereof, recording information on such recording layer, and reproducing such information from such recording layer.

(8-1) Formatting of optical information recording media

As a preliminary preparation for recording information, the optical information recording medium is formatted either as a whole or partially. In this case, the recording layer of the optical information recording medium is formatted by irradiating one side of the recording layer with a formatting light emitted from a formatting-light source of an optical information recording reproduction device. The formatting light at that time has a sufficient amount of energy for effecting phase transition to α phase regardless of whether an irradiated portion prior to the irradiation with the formatting light is β phase or λ phase. With regard to the recording layer, the portion irradiated with the formatting light is phase-transited from β phase to α phase and then from α phase to λ phase, and also from λ phase to α phase and then from α phase to λ phase, thereby allowing the portion irradiated with the formatting light to all become λ phase, thus obtaining a uniform reflectance.

Namely, when, for example, associating a symbol of either "0" or "1" with a reflectance of returned light at the time of the light irradiation, no information is assumed to be recorded on the optical information recording medium at this stage since any portion of the optical information recording medium at this stage is uniformly associated with the symbol "0" (or the symbol "1").

(8-2) Recording of information

In order to record information on the optical information recording medium, a recording light with a given light intensity is collected on the recording layer by the optical information recording reproduction device. By allowing the optical information recording medium to be irradiated with the recording light, the crystal structure of the fine structural body 1 undergoes phase transition from λ phase to β phase in a localized area around a targeted spot for irradiation, thereby causing a reflectance in the vicinity of a focal point (β phase) of the recording light to differ from that in a surrounding area thereof (λ phase). As a result, there are formed record marks on the recording layer of the optical information recording medium, due to the fine structural body 1 undergoing phase transition from λ phase to β phase.

(8-3) Reproduction of information

In order to read the information recorded on the optical information recording medium, a reading light with a given light intensity is collected on the recording layer from the optical information recording reproduction device. The optical information recording medium allows a light receiving element of the optical information recording reproduction device to detect returned light from the recording layer, thus making it possible to reproduce the information recorded on the recording layer based on differences in reflectance due to dissimilarities (the presence of the record mark) in the crystal structure of the fine structural body 1. The reading light employed here has a light intensity not so large as to induce phase transition of the fine structural body 1 of the recording layer from λ phase to β phase when the recording layer is irradiated with the reading light. According to the aforementioned example, there are formed the record marks with the fine structural body phase-transited to β phase. However, the present invention is not limited to this configuration. As a matter of fact, there can also be formed the record marks with the fine structural body 1 phase-transited to λ phase. Here, the wavelengths of the recording light, the reading light and the formatting light may be 355 to 1064 nm, respectively.

However, the present invention is not limited to the present example. As a matter of fact, various modified examples are possible within the scope of the gist of the present invention. Namely, various other examples featuring other manufacturing methods and particle shapes or the like can be applied to the present invention, as long as the fine structural body 1 of the present invention is composed of the crystal structure comprised of $Ti_3O_5$ and maintaining the paramagnetic metal state in the temperature range of 0 to 800 K.

The invention claimed is:

1. A fine structural body comprising
a plurality of titanium oxide particles having a composition of $Ti_3O_5$ and further having
    a particle shape due to the titanium oxide particles bonded with one another, and
    a crystal structure being not phase-transited to β phase having a property of a nonmagnetic semiconductor when the temperature is equal to or lower than 460K and maintaining a paramagnetic metal state at all temperatures in a temperature range of 0K (exclusive) to 800K (inclusive).

2. The fine structural body according to claim 1, wherein said crystal structure forms an orthorhombic crystal structure in the paramagnetic metal state within a temperature range not less than 500K, and a monoclinic crystal structure in the paramagnetic metal state within a temperature range not more than 300K.

3. The magnetic memory comprising said magnetic layer formed by fixing said magnetic material on said supporting body, said magnetic material being provided by using said fine structural body according to claim 2.

4. The charge storage memory comprising said charge storage layer formed by fixing said charge storage material on said supporting body, said charge storage material being provided by using said fine structural body according to claim 2.

5. The optical information recording medium comprising said recording layer formed by using said fine structural body according to claim 2, said recording layer allowing said given recording light to be collected thereon at the time of recording information, thereby changing the crystal structure of said fine structural body in the vicinity of the focal point of said recording light so as to form record marks, thus allowing said information to be reproduced based on returned light according to said given reading light irradiated at the time of reproducing said information.

6. The fine structural body according to claim 2, wherein said monoclinic crystal structure in the paramagnetic metal state is phase-transited to a monoclinic β phase of a nonmagnetic semiconductor, when subjected to an external stimulus of an external force or a light.

7. The magnetic memory comprising said magnetic layer formed by fixing said magnetic material on said supporting body, said magnetic material being provided by using said fine structural body according to claim 6.

8. The charge storage memory comprising said charge storage layer formed by fixing said charge storage material on said supporting body, said charge storage material being provided by using said fine structural body according to claim 6.

9. The optical information recording medium comprising said recording layer formed by using said fine structural body according to claim 6, said recording layer allowing said given recording light to be collected thereon at the time of recording information, thereby changing the crystal structure of said fine structural body in the vicinity of the focal point of said recording light so as to form record marks, thus allowing said information to be reproduced based on returned light according to said given reading light irradiated at the time of reproducing said information.

10. The fine structural body according to claim 6, wherein said crystal structure phase-transited to the β phase is phase-transited to said orthorhombic crystal structure in the paramagnetic metal state, as a temperature is increased.

11. The magnetic memory comprising said magnetic layer formed by fixing said magnetic material on said supporting body, said magnetic material being provided by using said fine structural body according to claim 10.

12. The charge storage memory comprising said charge storage layer formed by fixing said charge storage material on said supporting body, said charge storage material being provided by using said fine structural body according to claim 10.

13. The optical information recording medium comprising said recording layer formed by using said fine structural body according to claim 10, said recording layer allowing said given recording light to be collected thereon at the time of recording information, thereby changing the crystal structure of said fine structural body in the vicinity of the focal point of said recording light so as to form record marks, thus allowing said information to be reproduced based on returned light according to said given reading light irradiated at the time of reproducing said information.

14. The fine structural body according to claim 1, wherein said crystal structure is produced by baking $TiO_2$ particles for a given period of time, in a given hydrogen atmosphere and at a given temperature.

15. The magnetic memory comprising said magnetic layer formed by fixing said magnetic material on said supporting body, said magnetic material being provided by using said fine structural body according to claim 14.

16. The charge storage memory comprising said charge storage layer formed by fixing said charge storage material on said supporting body, said charge storage material being provided by using said fine structural body according to claim 14.

17. The optical information recording medium comprising said recording layer formed by using said fine structural body according to claim 14, said recording layer allowing said given recording light to be collected thereon at the time of recording information, thereby changing the crystal structure of said fine structural body in the vicinity of the focal point of said recording light so as to form record marks, thus allowing said information to be reproduced based on returned light according to said given reading light irradiated at the time of reproducing said information.

18. The fine structural body according to claim 14, wherein said crystal structure is produced through a baking treatment of an hour or longer, in a hydrogen atmosphere of 0.1 L/min or more and at a temperature of 1100° C. to 1400° C.

19. The magnetic memory comprising said magnetic layer formed by fixing said magnetic material on said supporting body, said magnetic material being provided by using said fine structural body according to claim 18.

20. The charge storage memory comprising said charge storage layer formed by fixing said charge storage material on said supporting body, said charge storage material being provided by using said fine structural body according to claim 18.

21. The optical information recording medium comprising said recording layer formed by using said fine structural body according to claim 18, said recording layer allowing said given recording light to be collected thereon at the time of recording information, thereby changing the crystal structure of said fine structural body in the vicinity of the focal point of said recording light so as to form record marks, thus allowing said information to be reproduced based on returned light according to said given reading light irradiated at the time of reproducing said information.

22. A magnetic memory comprising a magnetic layer formed by fixing a magnetic material on a supporting body, said magnetic material being provided by using said fine structural body according to claim 1.

23. A charge storage memory comprising a charge storage layer formed by fixing a charge storage material on a supporting body, said charge storage material being provided by using said fine structural body according to claim 1.

24. An optical information recording medium comprising a recording layer formed by using said fine structural body according to claim 1, said recording layer allowing a given recording light to be collected thereon at a time of recording information, thereby changing the crystal structure of said fine structural body in the vicinity of a focal point of said recording light so as to form record marks, thus allowing said information to be reproduced based on returned light according to a given reading light irradiated at a time of reproducing said information.

25. The optical information recording medium according to claim 24, wherein said recording layer allows said record marks to be formed thereon by collecting said recording light thereon to cause its monoclinic crystal structure in the paramagnetic metal state to undergo phase transition to the monoclinic $\beta$ phase of the nonmagnetic semiconductor in the vicinity of a focal point of said recording light, while said recording layer allows said record marks to be erased therefrom by collecting formatting light on said monoclinic $\beta$ phase to cause said $\beta$ phase to undergo phase transition to the orthorhombic crystal structure in the paramagnetic metal state, and then to the monoclinic crystal structure in the paramagnetic metal state.

26. The optical information recording medium according to claim 24, wherein wavelengths of said recording light, said reading light and said formatting light are 355 to 1064 nm.

* * * * *